(12) United States Patent
Lee et al.

(10) Patent No.: US 8,674,571 B2
(45) Date of Patent: Mar. 18, 2014

(54) SOLAR POWERED WHEEL APPARATUS

(76) Inventors: William Edward Lee, Kailua, HI (US); Robert F. Pienkowski, Chicago, IL (US)

( * ) Notice: Subject to any disclaimer, the term of this patent is extended or adjusted under 35 U.S.C. 154(b) by 107 days.

(21) Appl. No.: 13/481,904

(22) Filed: May 28, 2012

(65) Prior Publication Data

US 2012/0293050 A1    Nov. 22, 2012

Related U.S. Application Data

(62) Division of application No. 13/008,004, filed on Jan. 17, 2011, now abandoned.

(60) Provisional application No. 61/295,800, filed on Jan. 18, 2010.

(51) Int. Cl.
*H02K 7/10* (2006.01)

(52) U.S. Cl.
USPC ............................ 310/75 C; 290/1 R

(58) Field of Classification Search
USPC ............ 310/75 C; 290/1 R; 180/2.1, 2.2
See application file for complete search history.

(56) References Cited

U.S. PATENT DOCUMENTS

| | | | | | |
|---|---|---|---|---|---|
| 4,516,647 | A | * | 5/1985 | Novak | 180/2.2 |
| 4,592,436 | A | * | 6/1986 | Tomei | 180/2.2 |
| 5,075,564 | A | * | 12/1991 | Hickey | 290/55 |
| 5,316,101 | A | * | 5/1994 | Gannon | 180/221 |
| 5,357,238 | A | * | 10/1994 | Terada | 340/425.5 |
| 7,453,167 | B2 | * | 11/2008 | Gilbert | 290/55 |
| 8,354,757 | B2 | * | 1/2013 | Lee et al. | 290/44 |
| 2007/0187952 | A1 | * | 8/2007 | Perlo et al. | 290/1 R |
| 2011/0174554 | A1 | * | 7/2011 | Lee et al. | 180/2.2 |
| 2011/0215587 | A1 | * | 9/2011 | Lee et al. | 290/55 |

* cited by examiner

*Primary Examiner* — Thanh Lam
(74) *Attorney, Agent, or Firm* — Ash Tankha; Lipton, Weinberger & Husick

(57) ABSTRACT

A solar powered wheel apparatus comprising one or more photovoltaic cells housed on a rotatable element connected to a rotary object such as a wheel, an electric motor, and an axial shaft. The electric motor is in electric communication with the photovoltaic cells that power the electric motor and is rigidly connected to the rotatable element that houses the photovoltaic cells. The axial shaft is rotatably connected to the electric motor and rigidly connected to a support structure of the rotary object. The electric motor converts electrical energy produced by the photovoltaic cells into mechanical energy causing the electric motor to rotate about the axial shaft. The rotation of the electric motor rotates the rigidly connected rotatable element that houses the photovoltaic cells. The rotation of the rotatable element housing the photovoltaic cells removes heat from the photovoltaic cells and causes rotation of the connected rotary object.

15 Claims, 43 Drawing Sheets

NEW SHEET

SOLAR POWERED WHEEL APPARATUS

CROSS REFERENCE TO RELATED APPLICATIONS

This application is a divisional of non-provisional patent application Ser. No. 13/008,004 titled "Solar Powered Wheel Apparatus", filed Jan. 17, 2011 now abandoned in the United States Patent and Trademark Office, which claims the benefit of provisional patent application No. 61/295,800 titled "Rotating Photovoltaic Cells In Wheels", filed on Jan. 18, 2010 in the United States Patent and Trademark Office.

The specification of the above referenced application is incorporated herein by reference in its entirety.

BACKGROUND

Conventional solar apparatuses for rotating a rotary object, for example, a wheel of a vehicle comprise static or stationary solar devices in electric communication with an electric motor. The electric motor generally forms the dynamic part of the solar apparatus executing rotations via a shaft. The static solar devices are exposed to sunlight to the extent possible and due to their static or stationary position throughout their operation, tend to heat up resulting in decreased electrical energy output. Consequently, this leads to a decrease in efficiency of conversion of solar energy into electrical energy by the solar devices and consequently a decrease in their efficiency for rotating rotary objects.

Hence, there is a long felt but unresolved need for a solar powered wheel apparatus and method that increases the efficiency of the solar devices and the electrical energy output of the solar devices to rotate a rotary object.

SUMMARY OF THE INVENTION

This summary is provided to introduce a selection of concepts in a simplified form that are further described in the detailed description of the invention. This summary is not intended to identify key or essential inventive concepts of the claimed subject matter, nor is it intended for determining the scope of the claimed subject matter.

The solar powered wheel apparatus disclosed herein addresses the above stated needs for increasing the efficiency of solar devices and their electrical energy output for rotating a rotary object. This is achieved by causing rotation of a rotatable element comprising one or more photovoltaic cells in order to increase their efficiency and their electrical energy output during operation of the solar powered wheel apparatus.

The solar powered wheel apparatus disclosed herein comprises one or more photovoltaic cells, an electric motor, and an axial shaft. The photovoltaic cells are housed on a rotatable element. As used herein, the term "rotatable element" refers to a panel comprising a packaged interconnected assembly of photovoltaic cells. The rotatable element is configured in one of multiple profiles, for example, a dome profile, a semispherical profile, a conical profile, a flat-ended profile, a trapezoidal profile, a pyramidal profile, and any combination thereof, to house multiple photovoltaic cells in different arrangements. The rotatable element is connected to a rotary object that needs to be rotated. As used herein, the term "rotary object" refers to any object that rotates on receiving mechanical energy and therefore moves from its initial position. The rotary object is, for example, a wheel of a vehicle such as a car, a bicycle, a wheel chair, a train, a space vehicle, a skateboard, etc., a rotor of a helicopter, a rotating amusement riding apparatus such as a carousel, a flying toy, etc. In an embodiment, the rotatable element that houses the photovoltaic cells is disposed on opposing sides of the rotary object. The photovoltaic cells capture solar energy from sunlight and convert the solar energy into electrical energy, for example, a direct current. In an embodiment, the solar powered wheel apparatus disclosed herein further comprises a transparent, weatherproof seal that encapsulates a front surface of the photovoltaic cells on the rotatable element for protecting the photovoltaic cells from water and weather conditions.

The electric motor, for example, a direct current motor, is in electric communication with the photovoltaic cells that power the electric motor. The electric motor is rigidly connected to the rotatable element that houses the photovoltaic cells. The axial shaft is rotatably connected to the electric motor, for example, by one or more bearings. The axial shaft is also rigidly connected to a support structure of the rotary object, for example, to the chassis of the vehicle extending from a rim of the wheel of the vehicle. The electric motor converts the electrical energy produced by the photovoltaic cells into mechanical energy and rotates about the axial shaft. The rotation of the electric motor rotates the rigidly connected rotatable element that houses the photovoltaic cells. The rotation of the rotatable element housing the photovoltaic cells by the electric motor removes heat from the photovoltaic cells and allows the photovoltaic cells to operate at a lower temperature. This rotation of the rotatable element housing the photovoltaic cells increases the efficiency and the electrical energy output of the photovoltaic cells. The rotation of the rotatable element by the electric motor causes rotation of the connected rotary object, for example, the wheel of a vehicle. For example, the rotation of the rotatable element connected to each of the wheels of a vehicle, for example, a bicycle, a car, etc., propels the vehicle.

In an embodiment, the rotatable element that houses the photovoltaic cells protrudes outwardly from the connected rotary object. In another embodiment, the rotatable element that houses the photovoltaic cells is hingedly connected to the rotary object for angularly displacing the rotatable element from the rotary object to increase exposure of the photovoltaic cells to sunlight. The exposed photovoltaic cells capture additional solar energy and convert the captured solar energy into electrical energy, when the rotary object is stationary. In another embodiment, the rotatable element comprises a ring shaped panel and multiple rectangular panels rigidly connected to the rotary object for housing the photovoltaic cells. Each of the rectangular panels radially extends from an upper surface of the electric motor to the ring shaped panel. A first end of each of the rectangular panels is electrically connected to the upper surface of the electric motor. A second end of each of the rectangular panels is connected to the ring shaped panel.

In another embodiment, the solar powered wheel apparatus further comprises one or more reflectors in multiple positions on a body frame mounted on the rotary object. The reflectors are disposed proximal to the photovoltaic cells housed on the rotatable element and positioned to concentrate the solar energy on the photovoltaic cells. This concentration of solar energy on the photovoltaic cells directs additional solar energy towards the photovoltaic cells and enables the photovoltaic cells to produce additional electrical energy for rotating the rotary object via the electric motor.

In another embodiment, the solar powered wheel apparatus further comprises one or more concentrator lenses disposed on the rotatable element. The concentrator lenses, for example, Fresnel lenses, are mounted on the photovoltaic cells housed on the rotatable element. The concentrator lenses concentrate and direct the solar energy towards the photovoltaic cells for increasing the amount of electrical energy output of the photovoltaic cells.

In another embodiment, the rotation of the rotary object by the electric motor is used for driving multiple second rotary objects. For example, the rotation of the rotary object drives multiple interconnected wheels of a vehicle, for example, a train. In this embodiment, the solar powered wheel apparatus further comprises a drive mechanism, for example, a ring gear, rigidly connected around the rotatable element connected to the rotary object and each of the second rotary objects. Intermediary gears are provided to interconnect the rotary object and the second rotary objects. The drive mechanism of the rotary object engageably communicates with the drive mechanism of the second rotary objects for transferring the mechanical energy produced by the electric motor of the rotary object to the second rotary objects.

In another embodiment, the solar powered wheel apparatus further comprises an energy storage device, for example, a battery, in electric communication with the photovoltaic cells on the rotatable element and disposed within the support structure connected to the rotary object. The energy storage device stores the electrical energy produced by the photovoltaic cells. In another embodiment, the solar powered wheel apparatus further comprises slip rings, in electric communication with the photovoltaic cells on the rotatable element, the energy storage device, and the electric motor for transferring the electrical energy produced by the photovoltaic cells to the energy storage device for storage of the electrical energy and for enabling transfer of the stored electrical energy from the energy storage device to the electric motor. In another embodiment, the slip rings transfer electrical energy from one rotatable element housing the photovoltaic cells on one opposing side of the rotary object to the electric motor in electric communication with the photovoltaic cells of the rotatable element on the other opposing side of the rotary object. In another embodiment, transfer of electrical energy from the photovoltaic cells to the electric motor through the slip rings is controlled electronically to transfer power equally between each rotary object of multiple interconnected rotary objects.

In another embodiment, the solar powered wheel apparatus further comprises an extendable hydraulic arm connected to the support structure of the rotary object. The extendable hydraulic arm comprises a first end and a second end. The first end of the extendable hydraulic arm defines a hinge joint for pivotally connecting the rotatable element that houses the photovoltaic cells via the axial shaft rotatably connected to the electric motor, where the electric motor is electrically connected to the rotatable element. The second end of the extendable hydraulic arm rigidly connects to the support structure of the rotary object. The extendable hydraulic arm is extended from the support structure of the rotary object, and the pivotally connected rotatable element is angularly displaced via the hinge joint for increasing exposure of the photovoltaic cells to sunlight. The exposed photovoltaic cells capture additional solar energy and convert the captured solar energy into electrical energy, when the rotary object is stationary.

During operation of the solar powered wheel apparatus disclosed herein, the rotatable element that houses the photovoltaic cells continuously rotates along with the electric motor and the rotary object, thereby lowering temperature of the photovoltaic cells and enabling better efficiency in producing electrical energy. When the efficiency and the electrical energy output of the photovoltaic cells is increased due to the rotation of the rotatable element that houses the photovoltaic cells, the electric motor is provided with greater amounts of electrical energy and this enables the electric motor to rotate with faster revolutions per unit of time. The electric motor executes higher revolutions per minute (rpm) when electrically connected to rotating photovoltaic cells as compared to static or stationary photovoltaic cells. The rotation of the photovoltaic cells ensures that the rotation of the electric motor is increased to a predetermined value such that there is optimum efficiency from the photovoltaic cells, in particular, and the solar powered wheel apparatus as a whole.

The rotation of the electric motor rotates the rotatable element that houses the photovoltaic cells, when the photovoltaic cells convert solar energy into electrical energy. This rotation of the photovoltaic cells ensures an extended life span or better mean time before failure (MTBF) of the photovoltaic cells, since the photovoltaic cells operate at a much lower temperature, thereby offering better efficiency in electrical energy output.

BRIEF DESCRIPTION OF THE DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific components and methods disclosed herein.

DETAILED DESCRIPTION OF THE INVENTION

Figure 1:
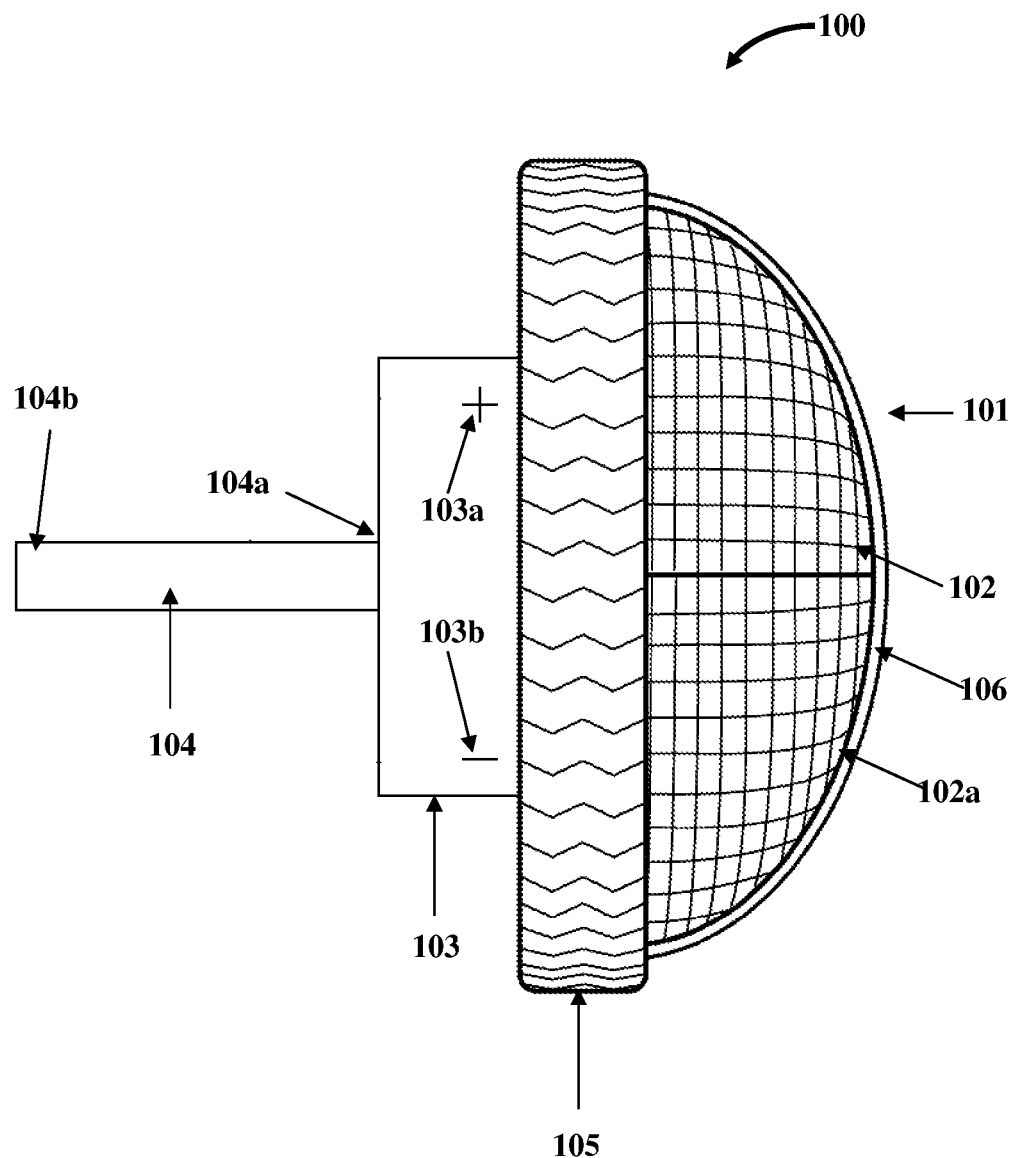
FIG. 1 exemplarily illustrates a side orthogonal view of a solar powered wheel apparatus, where a rotatable element that houses photovoltaic cells is connected to a rotary object.

FIG. 1 exemplarily illustrates a side orthogonal view of a solar powered wheel apparatus 100, where a rotatable element 101 that houses photovoltaic cells 102 is connected to a rotary object 105, for example, a wheel. The solar powered wheel apparatus 100 disclosed herein comprises one or more photovoltaic cells 102, an electric motor 103, and an axial shaft 104. The photovoltaic cells 102 are housed on the rotatable element 101. As used herein, the term "rotatable element" refers to a panel 101 comprising a packaged interconnected assembly of photovoltaic cells 102. The rotatable element 101 is configured in one of multiple profiles, for example, a dome profile, a semi-spherical profile, a conical profile, a flat-ended profile, a trapezoidal profile, a pyramidal profile, and any combination thereof, to house multiple photovoltaic cells 102 in different arrangements as disclosed in the detailed description of FIGS. 8A-8D. The rotatable element 101 is connected to a rotary object 105 that needs to be rotated. As used herein, the term "rotary object" refers to any object that rotates on receiving mechanical energy and therefore moves from its initial position. The rotary object 105 is, for example, a wheel of a vehicle such as a car 900, a bicycle 3500, a wheel chair, a train 3900, a truck 4000, a skateboard 4300, a space vehicle 4200, a helicopter 1900, etc., a rotating amusement riding apparatus 4100 such as a carousel, a flying toy, etc., as exemplarily illustrated in FIGS. 9-14, FIG. 19, FIG. 29, FIG. 35, FIG. 39, FIG. 40, FIGS. 41A-41C, FIG. 42, and FIG. 43. Also, as used herein, the term "vehicle" refers to a transport or conveyance mechanism, for example, a car 900, a helicopter 1900, a bicycle 3500, a train 3900, a truck 4000, a space vehicle 4200, a skateboard 4300, etc., that carries and transports persons and goods from one place to another or moves from one place to another.

For purposes of illustration, the detailed description refers to the solar powered wheel apparatus 100 being connected to a rotary object 105, for example, a wheel of a vehicle such as a car 900, a helicopter 1900, a bicycle 3500, a train 3900, a truck 4000, a rotating amusement riding apparatus 4100 such as a carousel, a space vehicle 4200, and a skateboard 4300; however the solar powered wheel apparatus 100 can be incorporated in a wheel of any type of vehicle or automobile, for example, motorbikes, trams, carriages, wheelchairs, self-balancing electric vehicles, etc., tractors, farm equipment, flying toys, etc.

The rotatable element 101 housing the photovoltaic cells 102 protrudes outwardly from the connected rotary object 105. The photovoltaic cells 102 housed on the rotatable element 101 capture solar energy and convert the solar energy into electrical energy by the photovoltaic effect. The photovoltaic cell 102 is made from a semiconductor material. When a photon is absorbed by the photovoltaic cell 102, electrons from the atoms of the semiconductor material are dislodged from their position. These electrons travel toward the front surface 102a of the photovoltaic cell 102 and flow on the front surface 102a of the photovoltaic cell 102. This flow of electrons generates electrical energy. In an embodiment, a laser emitter that produces laser beams at a particular frequency may be provided. The laser beams are focused onto the photovoltaic cells 102 on the rotatable element 101. The laser beams are equipped with higher frequencies of energy and improve the efficiency of the photovoltaic cells 102. The photovoltaic cells 102 are in resonance with a wavelength of the laser beam, that is, the photovoltaic cells 102 are configured to match the frequencies of the laser beam. The photovoltaic cells 102 convert energy possessed by the laser beam into electrical energy.

The electric motor 103 is in electric communication with the photovoltaic cells 102 that power the electric motor 103. The electric motor 103 is, for example, a direct current (DC) motor. The electric motor 103 is rigidly connected to the rotatable element 101 that houses the photovoltaic cells 102. The axial shaft 104 is rotatably connected to the electric motor 103. The axial shaft 104 is also rigidly connected to a support structure 115 of the rotary object 105, for example, to a chassis of a car 900 as exemplarily illustrated in FIG. 23 and FIG. 29. As used herein, the term "support structure" refers to a structural framework of a vehicle, for example, the chassis of a car 900 that comprises support elements such as an arbor 108, fastening plates 113, etc., as exemplarily illustrated in FIGS. 7A-7B, FIG. 23, and FIG. 29. The axial shaft 104 comprises a first end 104a and a second end 104b. The first end 104a of the axial shaft 104 is rotatably connected to the electric motor 103, and the second end 104b of the axial shaft 104 is rigidly connected to the support structure 115. The rotary object 105 is herein referred to as a wheel and referenced by the numeral 105. The axial shaft 104 extends from a rim 105c of the wheel 105 of the car 900 as exemplarily illustrated in FIG. 7B, FIG. 9 and FIG. 15. The electric motor 103 converts the electrical energy produced by the photovoltaic cells 102 into mechanical energy and rotates about the axial shaft 104. The rotation of the electric motor 103 rotates the rigidly connected rotatable element 101 that houses the photovoltaic cells 102.

The rotation of the rotatable element 101 housing the photovoltaic cells 102 by the electric motor 103 removes heat from the photovoltaic cells 102 and allows the photovoltaic cells 102 to operate at a lower temperature. This rotation of the photovoltaic cells 102, during operation of the solar powered wheel apparatus 100, increases the efficiency and the electrical energy output of the photovoltaic cells 102. The rotation of the rotatable element 101 by the electric motor 103 causes rotation of the connected rotary object 105. For example, the rotation of the rotatable element 101 connected to each of the wheels 105 of a vehicle, for example, a car 900, a bicycle 3500, a train 3900, a truck 4000, a space vehicle 4200, a skateboard 4300, etc., propels the vehicle 900, 3500, 3900, 4000, 4200, 4300, etc.

The rotation of the electric motor 103 rotates the rigidly connected rotatable element 101 that houses the photovoltaic cells 102 when the photovoltaic cells 102 convert solar energy into electrical energy. This rotation of the photovoltaic cells 102 ensures an extended life span or better mean time before failure (MTBF) of the photovoltaic cells 102, since the photovoltaic cells 102 operate at a much lower temperature, thereby offering better efficiency in electrical energy output. The life span of the photovoltaic cells 102 is extended and sustained, before mechanical efficiency of the photovoltaic cells 102 reduces which requires the user to replace the photovoltaic cells 102 with new photovoltaic cells 102.

In an embodiment, the solar powered wheel apparatus 100 further comprises a transparent, weatherproof seal 106 that encapsulates a front surface 102a of the photovoltaic cells 102 on the rotatable element 101 for protecting the photovoltaic cells 102 from water and weather conditions.

Figure 2:
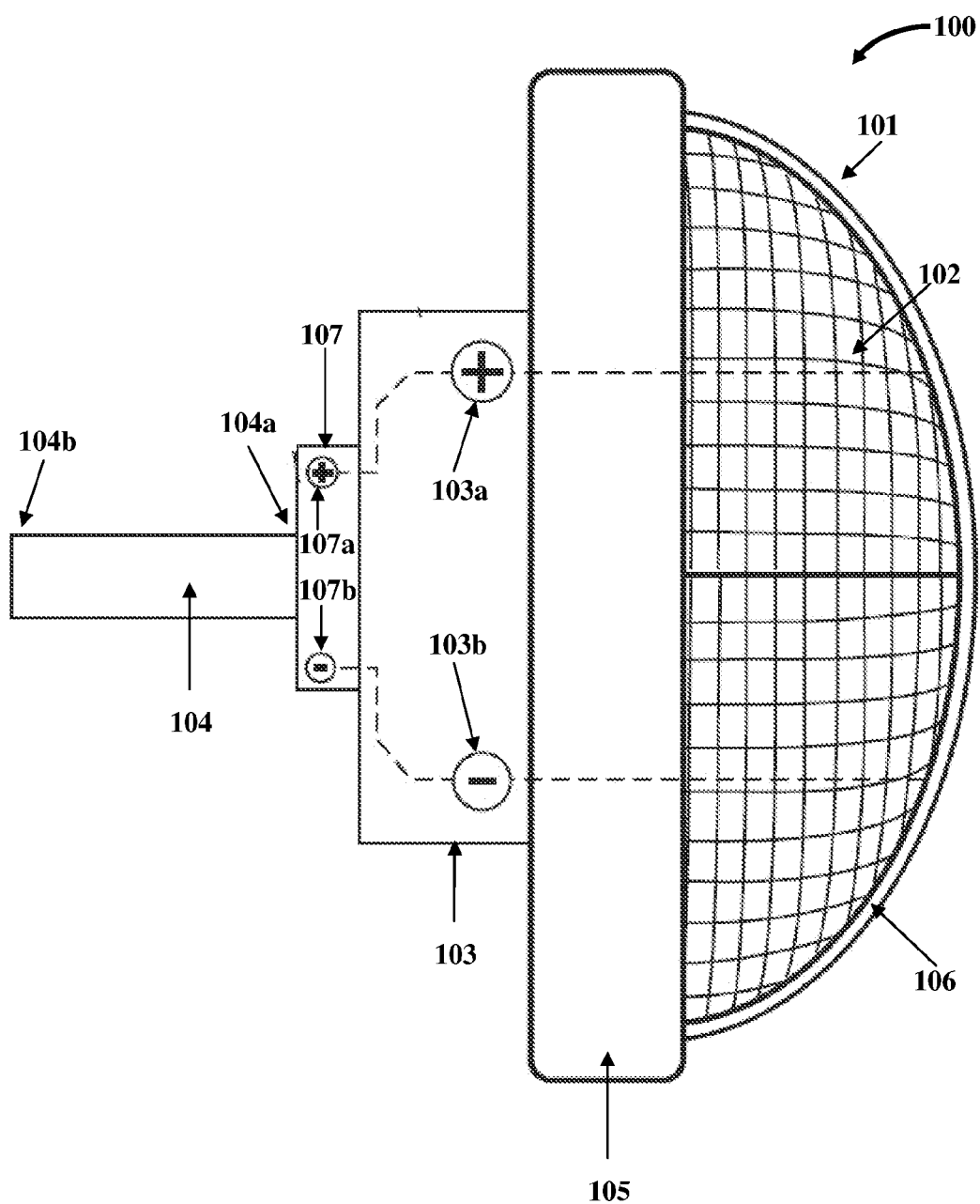
FIG. 2 exemplarily illustrates a side orthogonal view of an embodiment of the solar powered wheel apparatus, showing a slip ring in electric communication with an electric motor of the solar powered wheel apparatus.

FIG. 2 exemplarily illustrates a side orthogonal view of an embodiment of the solar powered wheel apparatus 100, showing a slip ring 107 in electric communication with an electric motor 103 of the solar powered wheel apparatus 100. The electric motor 103 is in electric communication with the photovoltaic cells 102 that power the electric motor 103 via electric terminals 107a and 107b of the slip ring 107. The electric terminals 107a and 107b of the slip ring 107 are, for example, a positive electric terminal 107a and a negative electric terminal 107b. The positive electric terminal 107a of the slip ring 107 is connected to the positive electric terminal 103a of the electric motor 103. The negative electric terminal 107b of the slip ring 107 is connected to the negative electric terminal 103b of the electric motor 103. The slip ring 107 is disposed coaxial to the electric motor 103 and the axial shaft 104. The slip ring 107 is a rotary interface and makes an electric connection with the photovoltaic cells 102 via the electric motor 103. The slip ring 107 is a band made of a conducting material. The slip ring 107 is mounted on the axial shaft 104 and insulated from the axial shaft 104. The slip ring 107 transfers electrical energy produced by the photovoltaic cells 102 to an energy storage device 126, for example, a battery, for storage of the electrical energy as exemplarily disclosed in FIG. 29. The energy storage device 126 may be disposed within the support structure 115 of a car 900 as exemplarily illustrated in FIG. 29. The slip ring 107 facilitates bidirectional transfer of electrical energy from the photovoltaic cells 102. For example, the slip ring 107 transfers the electrical energy from the photovoltaic cells 102 to the electric motor 103 and to the energy storage device 126, and from the energy storage device 126 to the electric motor 103. The slip ring 107 also keeps the axial shaft 104 and the support structure 115 of the car 900 stable. During operation, electrical energy is transferred from the photovoltaic cells 102 to the energy storage device 126 that stores the electrical energy. The energy storage device 126 acts as a reservoir for storing electrical energy and for transferring the electrical energy to the electric motor 103. The energy storage device 126 powers the electric motor 103, which converts the electrical energy into mechanical energy.

Figure 3:
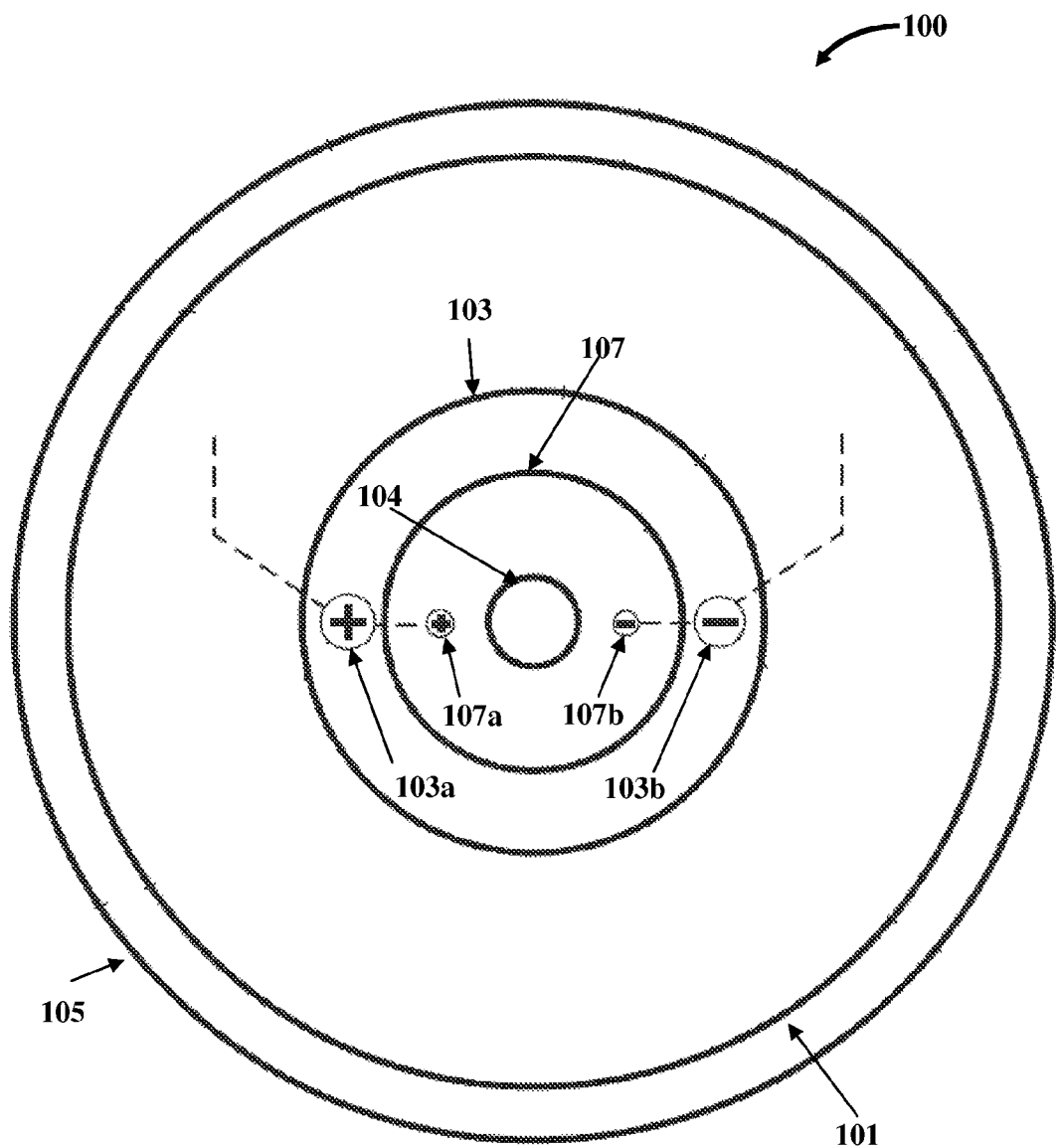
FIG. 3 exemplarily illustrates a sectional view of the solar powered wheel apparatus, showing the electric terminals of the electric motor and the electric terminals of the slip ring of the solar powered wheel apparatus.

FIG. 3 exemplarily illustrates a sectional view of the solar powered wheel apparatus 100, showing the electric terminals 103a and 103b of the electric motor 103 and the electric terminals 107a and 107b of the slip ring 107 of the solar powered wheel apparatus 100. The slip ring 107 is concentric with the rotatable element 101 and is arranged such that the electric terminals 107a and 107b of the slip ring 107 are in series with the electric terminals 103a and 103b of the electric motor 103. For example, the positive electric terminals 107a and 103a of the slip ring 107 and the electric motor 103 respectively, and the negative electric terminals 107b and 103b of the slip ring 107 and the electric motor 103 respectively are coupled together. The slip ring 107 enables transfer of electrical energy from the rotating or stationary photovoltaic cells 102 to the energy storage device 126 for storage. Since the photovoltaic cells 102 on the rotatable element 101 are continuously rotating, the slip ring 107 allows the rotating photovoltaic cells 102 to transfer the electrical energy to the energy storage device 126. When the wheels 105 of the vehicle, for example, a car 900, and the photovoltaic cells 102 are stationary, the slip ring 107 continue to facilitate the transfer of the electrical energy from the photovoltaic cells 102 to the energy storage device 126. The energy storage device 126 stores the electrical energy, and transfers the electrical energy to the electric motor 103 via the slip ring 107.

Figure 4:
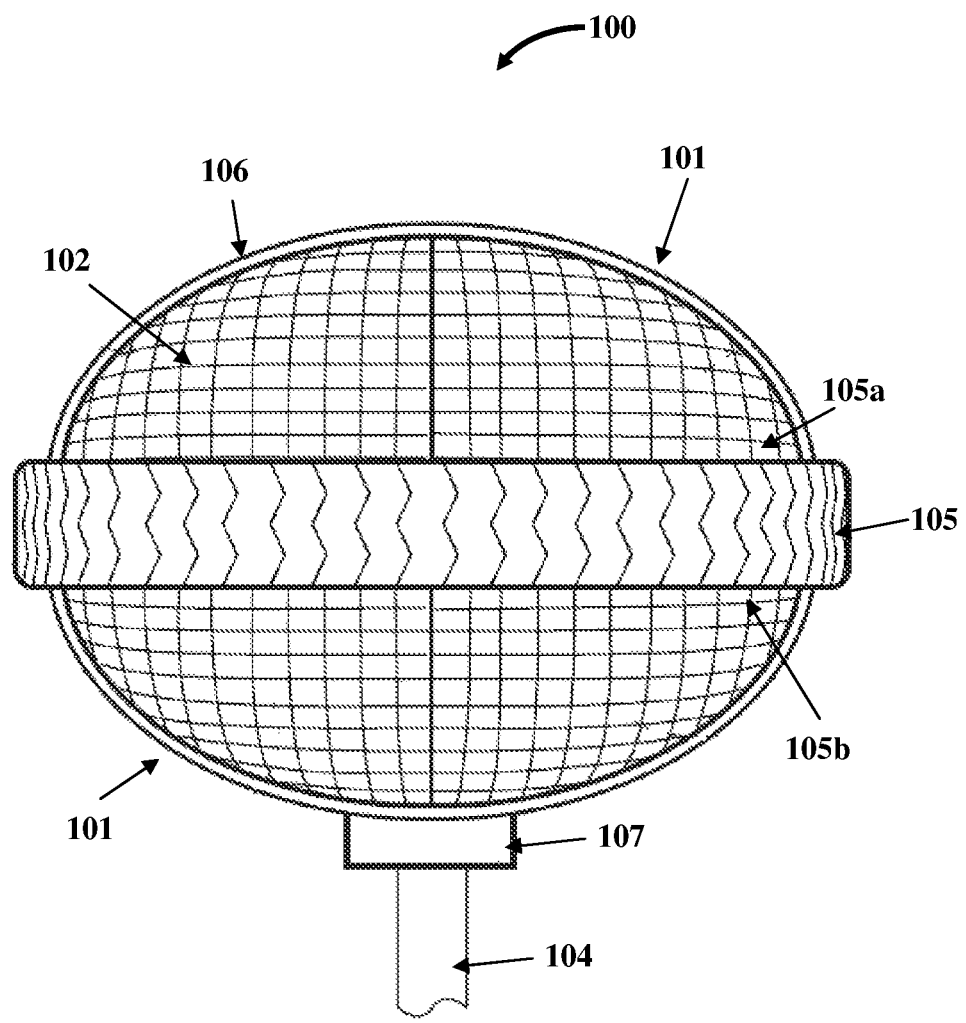
FIG. 4 exemplarily illustrates a top view of an embodiment of the solar powered wheel apparatus, showing a rotatable element that houses photovoltaic cells disposed on opposing sides of a rotary object.

FIG. 4 exemplarily illustrates a top view of an embodiment of the solar powered wheel apparatus 100, showing a rotatable element 101 that houses photovoltaic cells 102 disposed on opposing sides 105a and 105b of a rotary object 105 herein referred to as a "wheel". In this embodiment, the rotatable element 101 protrudes outwardly from each of the opposing sides 105a and 105b of the wheel 105. Each rotatable element 101 is encapsulated by a transparent, weatherproof seal 106 that protects the photovoltaic cells 102 from water and weather conditions. Encapsulation of the photovoltaic cells 102 enables the photovoltaic cells 102 to operate under different weather conditions. The electric motor 103 is in electric communication with the photovoltaic cells 102 on each rotatable element 101. The photovoltaic cells 102 on each rotatable element 101 powers the electric motor 103 and causes rotation of the electric motor 103 about the axial shaft 104. The rotation of the electric motor 103 rotates each rigidly connected rotatable element 101 housing the photovoltaic cells 102. The rotation of each rotatable element 101 housing the photovoltaic cells 102 removes heat from the photovoltaic cells 102 and causes rotation of the connected wheel 105.

Figure 5:
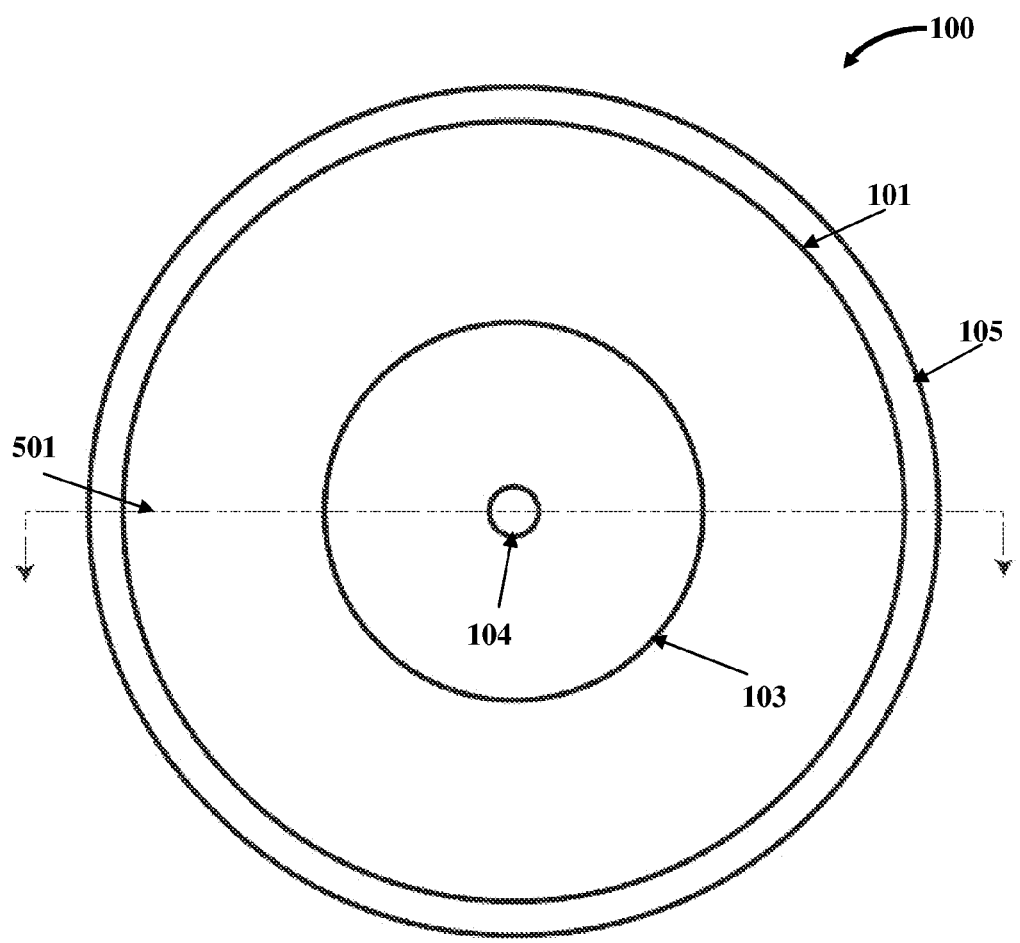
FIG. 5 exemplarily illustrates a sectional view of an embodiment of the solar powered wheel apparatus.

FIG. 5 exemplarily illustrates a sectional view of an embodiment of the solar powered wheel apparatus 100. FIG. 5 shows the axis 501 along which the sectional view of FIG. 6 is defined.

Figure 6:
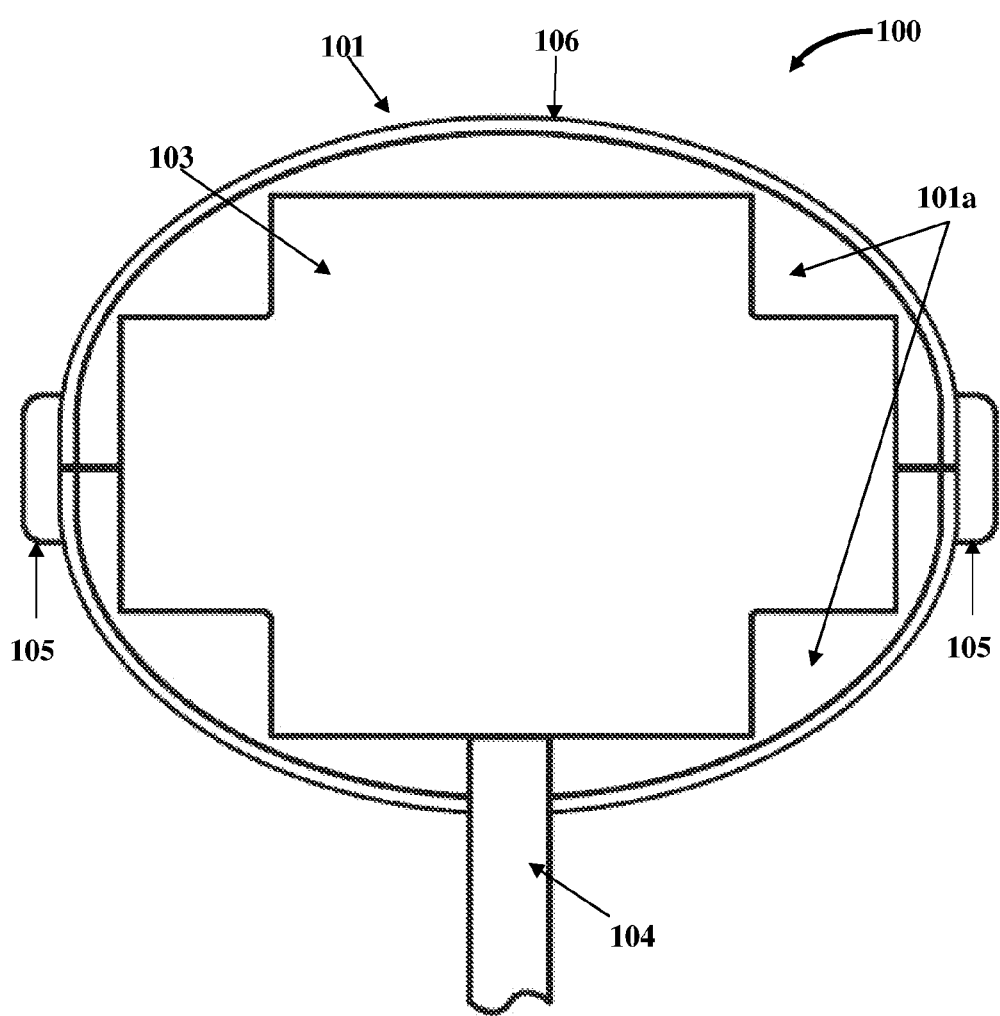
FIG. 6 exemplarily illustrates a sectional view of an embodiment of the solar powered wheel apparatus, showing a rotatable element that houses photovoltaic cells disposed on opposing sides of a rotary object.

FIG. 6 exemplarily illustrates a sectional view of an embodiment of the solar powered wheel apparatus 100, showing a rotatable element 101 that houses the photovoltaic cells 102 disposed on opposing sides 105a and 105b of a rotary object 105. The rotatable element 101 disposed on each of the opposing sides 105a and 105b of the rotary object 105 houses the photovoltaic cells 102. FIG. 6 shows the electric motor 103 disposed within a space 101a defined between the rotatable elements 101 disposed on the opposing sides 105a and 105b of the rotary object 105. The electric motor 103 receives the electrical energy from the photovoltaic cells 102 on both the rotatable elements 101, converts the electrical energy into mechanical energy, and rotates about the axial shaft 104. The rotation of the electric motor 103 rotates the rigidly connected rotatable elements 101 that house the photovoltaic cells 102, thereby causing rotation of the rotary object 105.

Figure 7A:
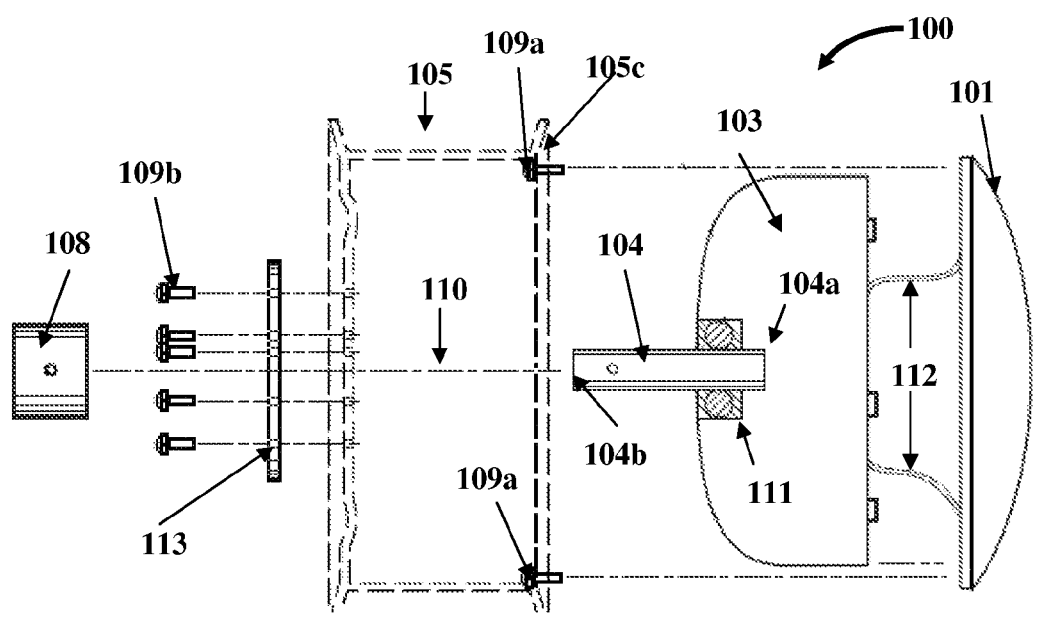
FIG. 7A exemplarily illustrates an exploded view of the solar powered wheel apparatus incorporated in the rim of a rotary object.

FIG. 7A exemplarily illustrate an exploded view of the solar powered wheel apparatus 100 incorporated in the rim 105c of a rotary object 105. The rotatable element 101 that houses the photovoltaic cells 102 is connected to the rim 105c of the rotary object 105, for example, by bolts 109a. The photovoltaic cells 102 on the rotatable element 101 electrically communicate with the electric motor 103 via leads 112 connected to the electric terminals 103a and 103b of the electric motor 103, for powering the electric motor 103. The electric motor 103 is rigidly connected to the rotatable element 101 that houses the photovoltaic cells 102. The electric motor 103 is disposed within the rim 105c of the rotary object 105 of a vehicle, for example, a car 900 as exemplarily illustrated in FIG. 9. The electric motor 103 rotates about the axial shaft 104 on being powered by the photovoltaic cells 102. The axial shaft 104 extends axially from the electric motor 103 to the support structure 115 of the car 900 as exemplarily illustrated in FIG. 7B. The support structure 115 of the car 900 comprises, for example, a support plate 114 and an arbor 108 rigidly connected to the axial shaft 104. The first end 104a of the axial shaft 104 is rotatably connected to the electric motor 103, and the second end 104b of the axial shaft 104 is rigidly connected to the support structure 115 of the car 900 as exemplarily illustrated in FIG. 23 and FIG. 29. In an embodiment, the solar powered wheel apparatus 100 further comprises one or more bearings 111 for rotatably connecting the first end 104a of the axial shaft 104 to the electric motor 103. The bearings 111 allow constrained relative motion between the axial shaft 104 and the electric motor 103.

The axial shaft 104 and the support structure 115 may be configured to interlock with each other to restrict relative motion, for example, using a fastening plate 113 and bolts 109b. The rigid connection of the axial shaft 104 to the support structure 115 of the car 900 causes the electric motor 103 to rotate in a direction, for example, a clockwise direction, about a central axis 110.

Figure 7B:
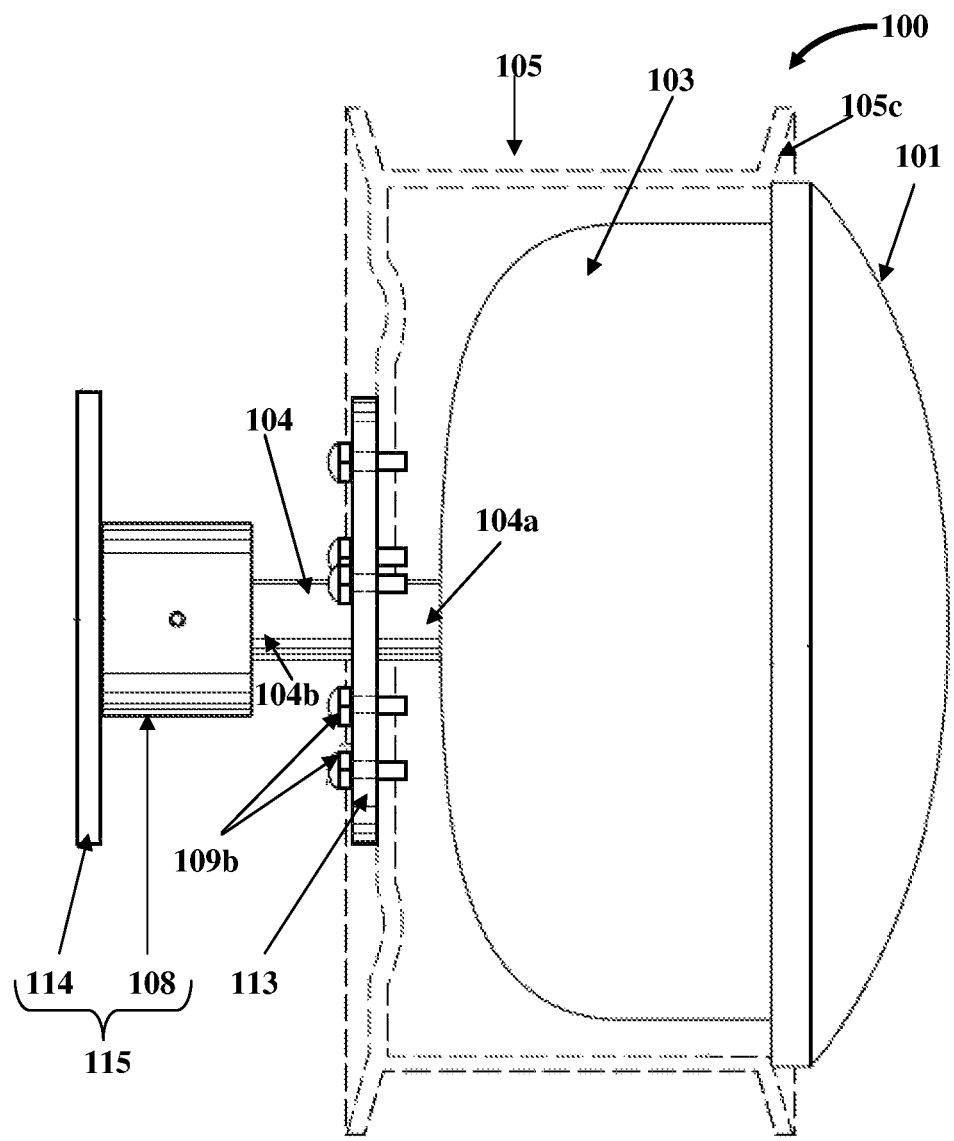
FIG. 7B exemplarily illustrates a side assembled view of the solar powered wheel apparatus incorporated in the rim of a rotary object.
Figure 8A:
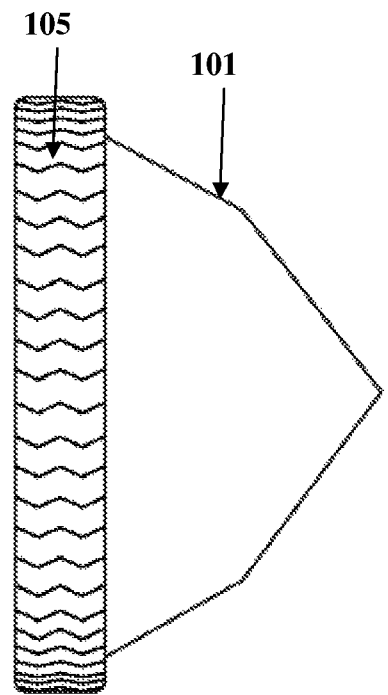
FIGS. 8A-8D exemplarily illustrate side orthogonal views of different profiles of a rotatable element connected to a rotary object.
Figure 8B:
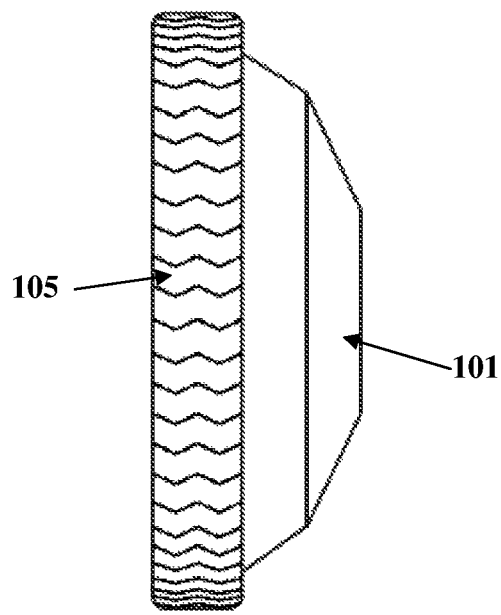
Figure 8C:
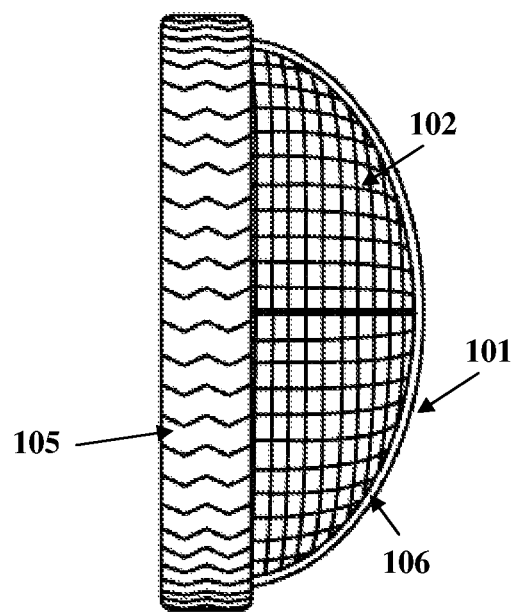
Figure 8D:
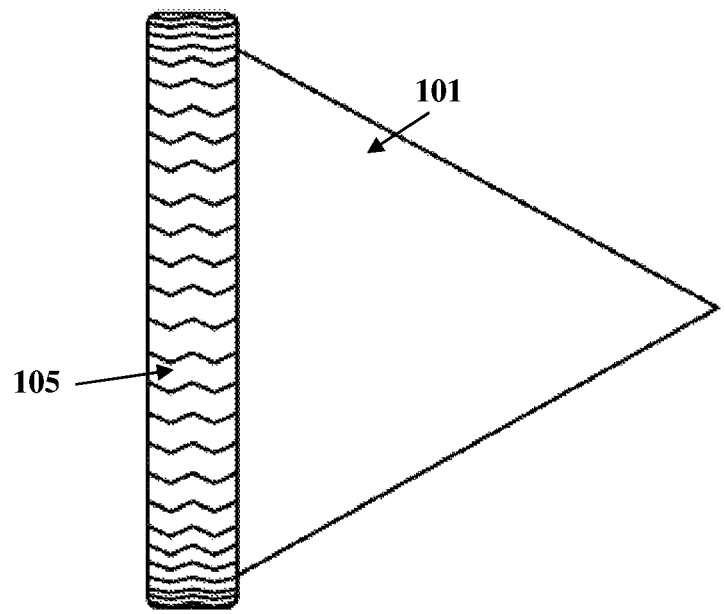

FIG. 7B exemplarily illustrates a side assembled view of the solar powered wheel apparatus 100 incorporated in the rim 105c of a rotary object 105. The assembled view of the solar powered wheel apparatus 100 shows the photovoltaic cells 102 on the rotatable element 101 rigidly connected to the rim 105c of the rotary object 105. The electric motor 103 electrically and rigidly connected to the rotatable element 101 is disposed within the rim 105c. The first end 104a of the axial shaft 104 is connected to the electric motor 103, while the second end 104b of the axial shaft 104 extends out of the rim 105c and is rigidly connected to the arbor 108. The arbor 108 is connected to a plate 114 that connects to the body frame 117 of a vehicle, for example, a car 900. The electric motor 103 converts the electrical energy produced by the photovoltaic cells 102 into mechanical energy for rotating itself about the axial shaft 104 and consequently rotating the rigidly connected photovoltaic cells 102. The electric motor 103 rotates the rigidly connected photovoltaic cells 102 at high revolutions per minute (rpm) about the central axis 110. The rotation of the electric motor 103 also causes rotation of the rotary object 105 such as the wheel 105, which propels the vehicle, for example, the car 900, in a linear direction.

The rotation of the photovoltaic cells 102 at high rpm lowers the temperature of the photovoltaic cells 102 by removing the heat buildup in the photovoltaic cells 102 and increases their solar energy conversion efficiency. The direction of rotation of the rotary object 105 can be reversed by reversing the leads 112 connected to the electric terminals 103a and 103b of the electric motor 103. For example, if the rotary object 105 is rotating in a counterclockwise direction, the vehicle, for example, the car 900, is propelled in a forward direction. If the leads 112 of the electric motor 103 are reversed, the rotary object 105 starts rotating in a clockwise direction, and the vehicle, for example, the car 900, is propelled in a reverse direction.

The reversal of the leads 112 of the electric motor 103 also serves as an electronic braking mechanism, where the rpm of the electric motor 103 is lowered to a nil value, that is, zero rpm, before the electric motor 103 starts rotating about the axial shaft 104 in a direction, for example, a clockwise direction, which is opposite to its first direction, that is, the counterclockwise direction.

FIGS. 8A-8D exemplarily illustrate side orthogonal views of different profiles of a rotatable element 101 connected to a rotary object 105. The rotatable element 101 is configured in multiple profiles for housing multiple photovoltaic cells 102. For example, the rotatable element 101 is configured in a pyramidal profile as exemplarily illustrated in FIG. 8A, a trapezoidal profile as exemplarily illustrated in FIG. 8B, a dome profile as exemplarily illustrated in FIG. 8C, and a conical shape as exemplarily illustrated in FIG. 8D. The profile of the rotatable element 101 is selected depending upon the application of the rotatable element 101. Different profiles of the rotatable element 101 accommodate different quantities of photovoltaic cells 102 that can be exposed to sunlight, thereby generating different electrical energy outputs. Furthermore, as the profile changes, the area of the rotatable element 101 that is exposed to sunlight varies, which varies the amount of electrical energy generated by the photovoltaic cells 102 housed on the area of the rotatable element 101. Each of the profiles of the rotatable element 101 allows different arrangements of photovoltaic cells 102 required to generate electrical energy.

Figure 9:
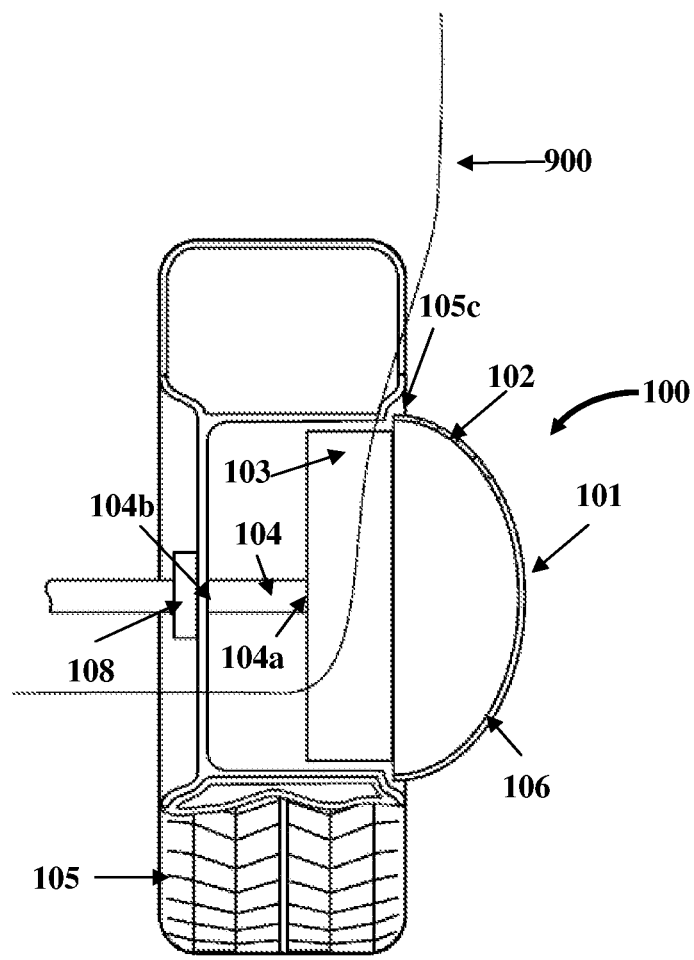
FIG. 9 exemplarily illustrates a side sectional view of the solar powered wheel apparatus provided in a rim of a wheel of a car.

FIG. 9 exemplarily illustrates a side sectional view of the solar powered wheel apparatus 100 provided in a rim 105c of a wheel 105 of a car 900. The solar powered wheel apparatus 100 disclosed herein comprises one or more photovoltaic cells 102 housed on the rotatable element 101, the electric motor 103, and the axial shaft 104. The rotatable element 101 housing the photovoltaic cells 102 protrudes outwardly from the wheel 105 for exposure to sunlight. The electric motor 103 is in electric communication with the photovoltaic cells 102 that power the electric motor 103. The axial shaft 104 is rotatably connected to the electric motor 103 and rigidly connected to the arbor 108 of the support structure 115 of the car 900 as exemplarily illustrated in FIG. 23 and FIG. 29. The first end 104a of the axial shaft 104 is rotatably connected to the electric motor 103, and the second end 104b of the axial shaft 104 is rigidly connected to the arbor 108 of the car 900. The electric motor 103 converts the electrical energy produced by the photovoltaic cells 102 into mechanical energy and rotates about the axial shaft 104, where the rotation of the electric motor 103 rotates the rigidly connected rotatable element 101 that houses the photovoltaic cells 102, and hence rotates the wheel 105.

Figure 10:
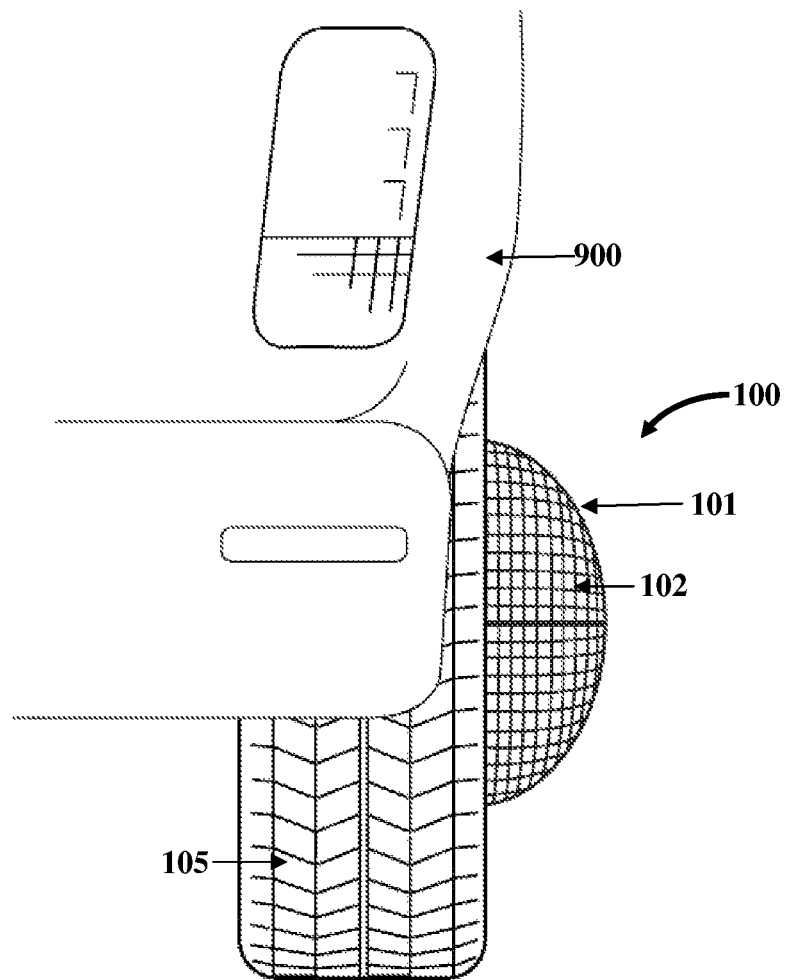
FIG. 10 exemplarily illustrates a side orthogonal view of the solar powered wheel apparatus provided in the rim of the wheel of a car.

FIG. 10 exemplarily illustrates a side orthogonal view of the solar powered wheel apparatus 100 provided in the rim 105c of the wheel 105 of a car 900. The rotatable element 101 that houses the photovoltaic cells 102 is rigidly connected to the rim 105c of the wheel 105 as exemplarily illustrated in FIG. 9. The solar powered wheel apparatus 100 can be incorporated on each or some of the wheels 105 of the car 900, as required by a user, to propel the car 900.

Figure 11:
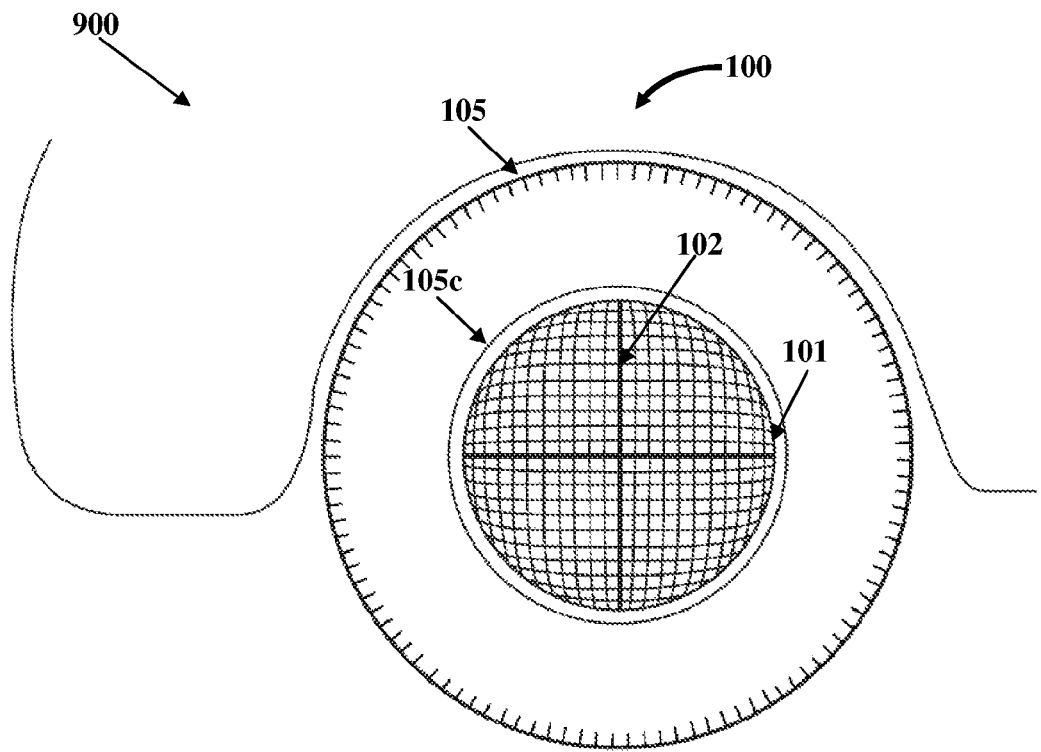
FIG. 11 exemplarily illustrates a front orthogonal view of the solar powered wheel apparatus provided in the rim of the wheel of a car.

FIG. 11 exemplarily illustrates a front orthogonal view of the solar powered wheel apparatus 100 provided in the rim 105c of the wheel 105 of a car 900. The solar powered wheel apparatus 100 disclosed herein is used for propelling the car 900, for example, in a linear direction. The solar powered wheel apparatus 100 disclosed herein comprises the photovoltaic cells 102 on the rotatable element 101 and the electric motor 103 having the axial shaft 104. The rotation of the wheel 105 by the electric motor 103 powered by the photovoltaic cells 102 of the solar powered wheel apparatus 100 propels the car 900 in the linear direction.

Figure 12:
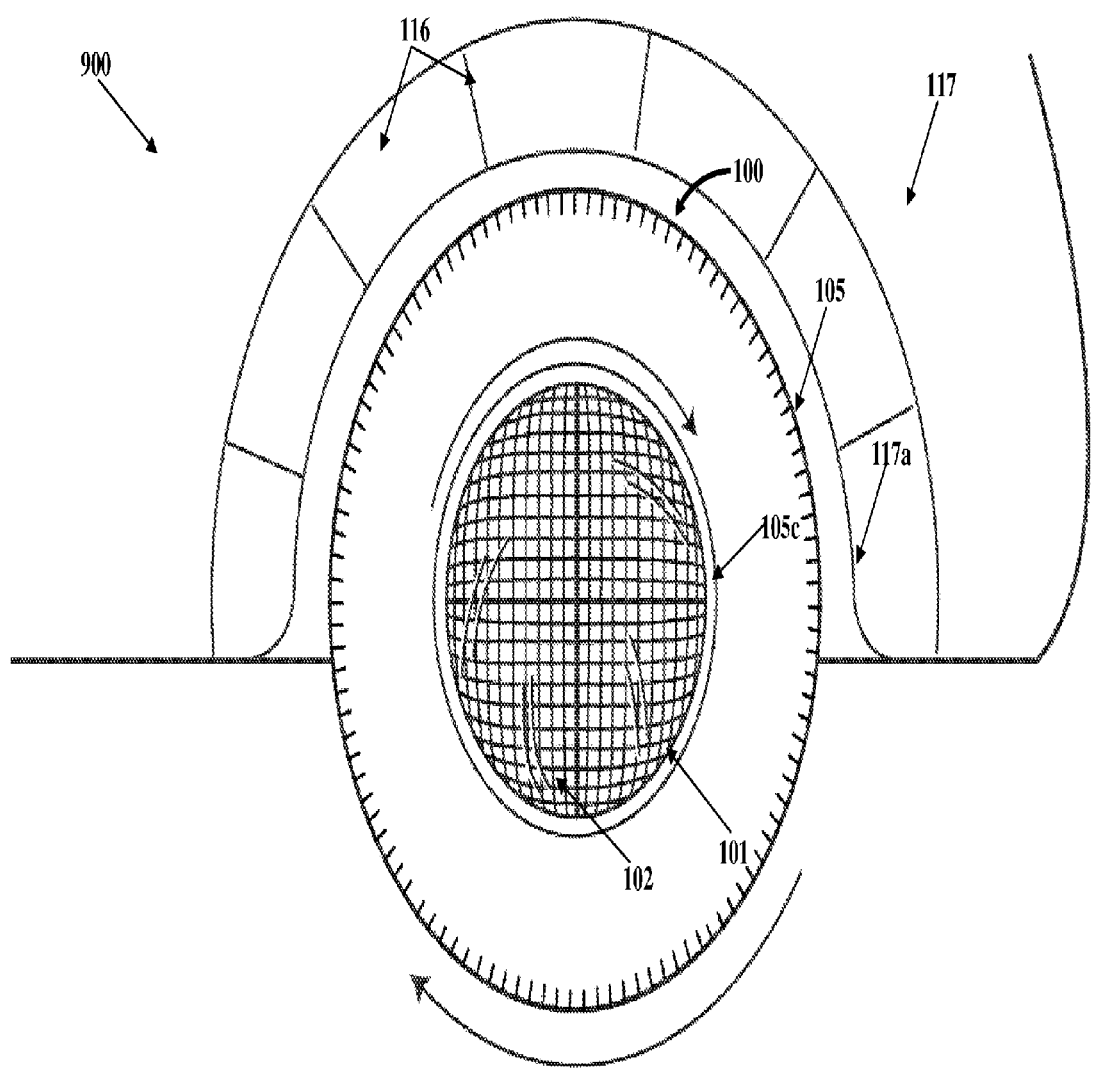
FIGS. 12-14 exemplarily illustrate embodiments of the solar powered wheel apparatus, showing multiple reflectors provided in multiple positions on a body frame of a car.
Figure 13:
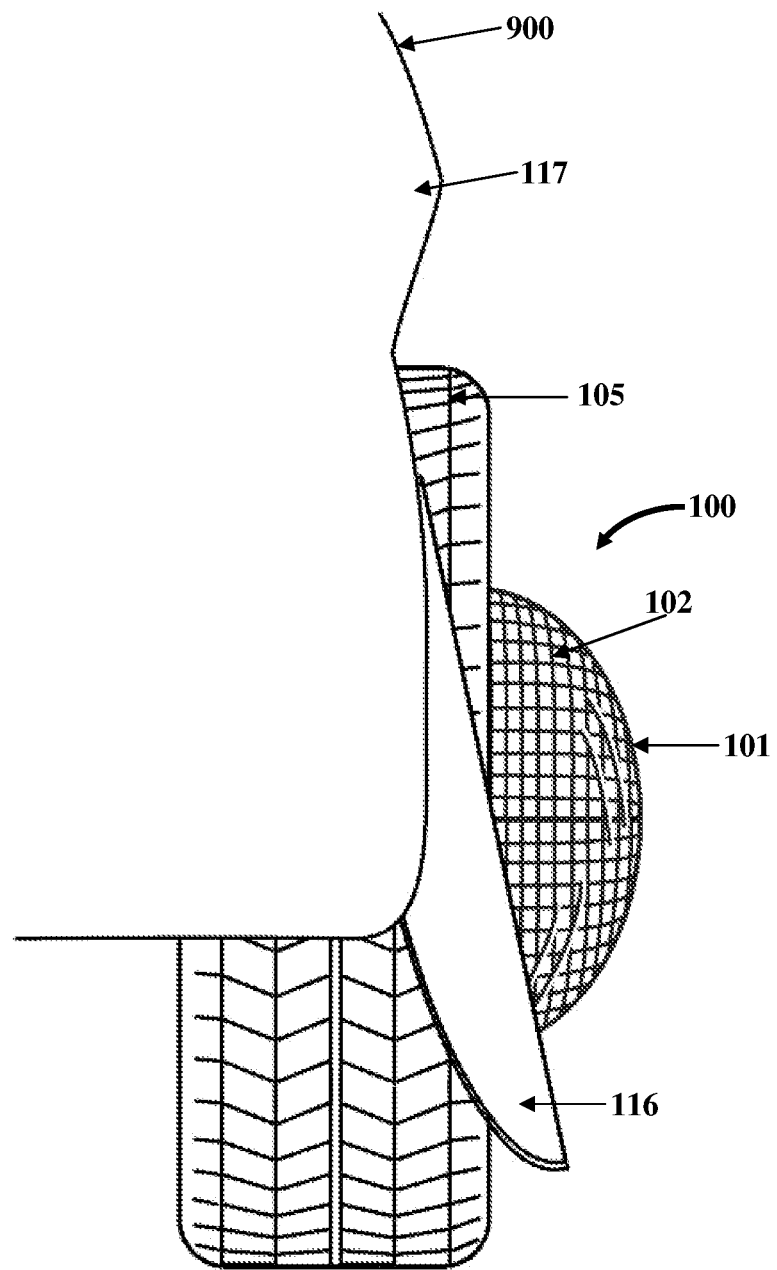
Figure 14:
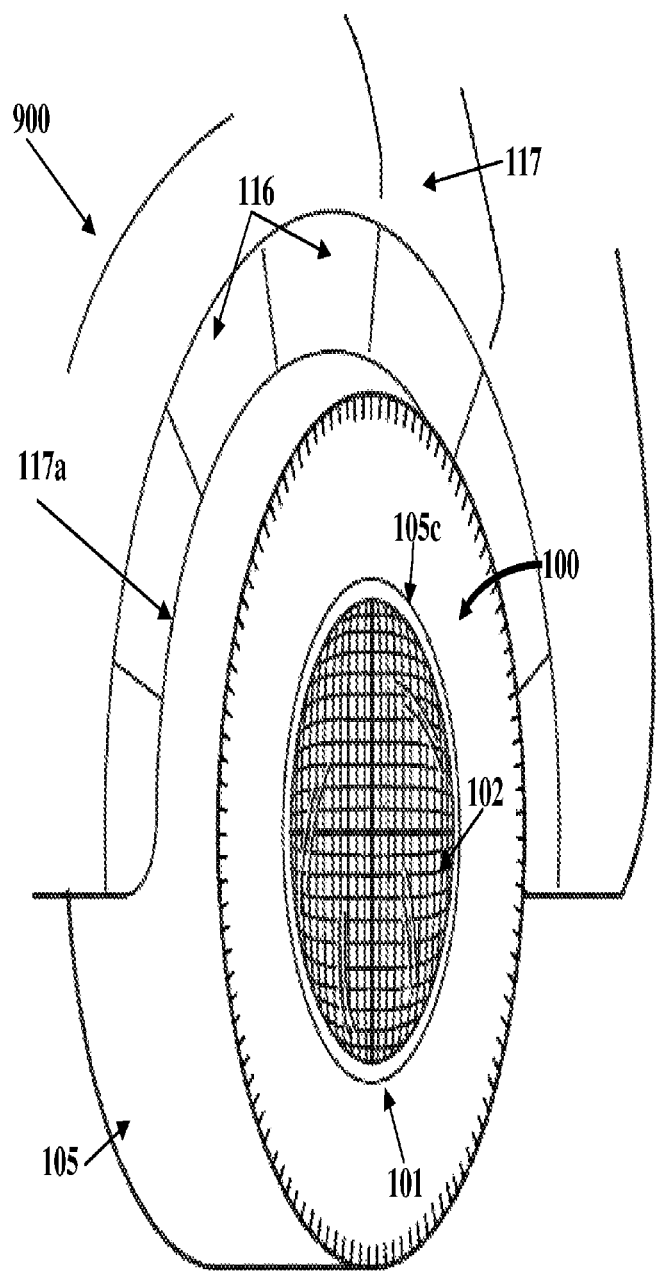

FIGS. 12-14 exemplarily illustrate embodiments of the solar powered wheel apparatus 100, showing multiple reflectors 116 provided in multiple positions on a body frame 117 of a car 900. The reflectors 116 are disposed proximal to the photovoltaic cells 102 housed on the rotatable element 101 and positioned to concentrate the solar energy on the photovoltaic cells 102. The reflectors 116 are of a highly polished surface made of, for example, a reflective plexi-glass, an aluminum strip, a stainless steel strip, etc. The reflectors 116 are used to direct solar energy from surrounding directions towards the photovoltaic cells 102.

In an embodiment of the solar powered wheel apparatus 100 as exemplarily illustrated in FIG. 12 and FIG. 14, the reflectors 116 are provided on a periphery 117a of the body frame 117 of the car 900 surrounding the rotary object 105 and disposed proximal to the photovoltaic cells 102 to reflect sunlight and direct the solar energy towards the photovoltaic cells 102, while the photovoltaic cells 102 rotate in the direction of the curved arrows together with the wheel 105.

In another embodiment of the solar powered wheel apparatus 100 as exemplarily illustrated in FIG. 13, the reflectors 116 are positioned alongside the photovoltaic cells 102 to direct the solar energy towards the photovoltaic cells 102. This type of arrangement also ensures that the photovoltaic cells 102 are not struck by stray objects such as stones, flints, dust, dirt, mud slings, etc., since the efficiency of the photovoltaic cells 102 may be reduced if mud, dirt, dust, etc., cover or damage the photovoltaic cells 102 and restrict the exposure of the photovoltaic cells 102 to sunlight and solar energy, when the car 900 is stationary or moves in a forward direction or a reverse direction. Hence, this type of arrangement of the reflectors 116 safeguards the photovoltaic cells 102 while directing the solar energy towards the photovoltaic cells 102.

As exemplarily illustrated in FIG. 14, the reflectors 116 are disposed on the periphery 117a of the body frame 117, and the photovoltaic cells 102 are housed on a rotatable element 101 having a flat-ended profile. The flat-ended rotatable element 101 of the photovoltaic cells 102 protects the photovoltaic cells 102 from stray objects, dust, dirt, etc. In another embodiment, multiple reflectors 116 are provided on a support member (not shown) connected to the body frame 117. The support member may be positioned below and in front of the photovoltaic cells 102.

The photovoltaic cells 102 housed on the rotatable element 101 are manufactured from various processes and materials or surface films, for example, silicon, aluminum, etc., that allow the photovoltaic cells 102 to capture a greater amount of solar energy to provide a higher conversion efficiency of the solar energy to electrical energy. The processes enable, for example, the provision of integrated reflectors 116 to concentrate solar energy on the photovoltaic cells 102. The photovoltaic cells 102 are also configured for flexibility, which assists the photovoltaic cells 102 in taking up a desired shape for capturing a greater amount of solar energy incident on the photovoltaic cells 102.

For purposes of illustration, the detailed description refers to multiple reflectors 116 in arrangements as disclosed in the detailed description of FIGS. 12-14; however the scope of the reflectors 116 is not limited to the arrangements disclosed herein but may be extended to various other positions and shapes depending on the functionality of safeguarding the photovoltaic cells 102, in addition to directing the solar energy towards the photovoltaic cells 102. For example, the reflectors 116 may be positioned above, below, or alongside the photovoltaic cells 102 or disposed on a support member rigidly connected to the body frame 117 of the car 900. The reflectors 116 of the embodiments exemplarily illustrated in FIGS. 12-14 are stationary during the operation of the solar powered wheel apparatus 100.

Figure 15:
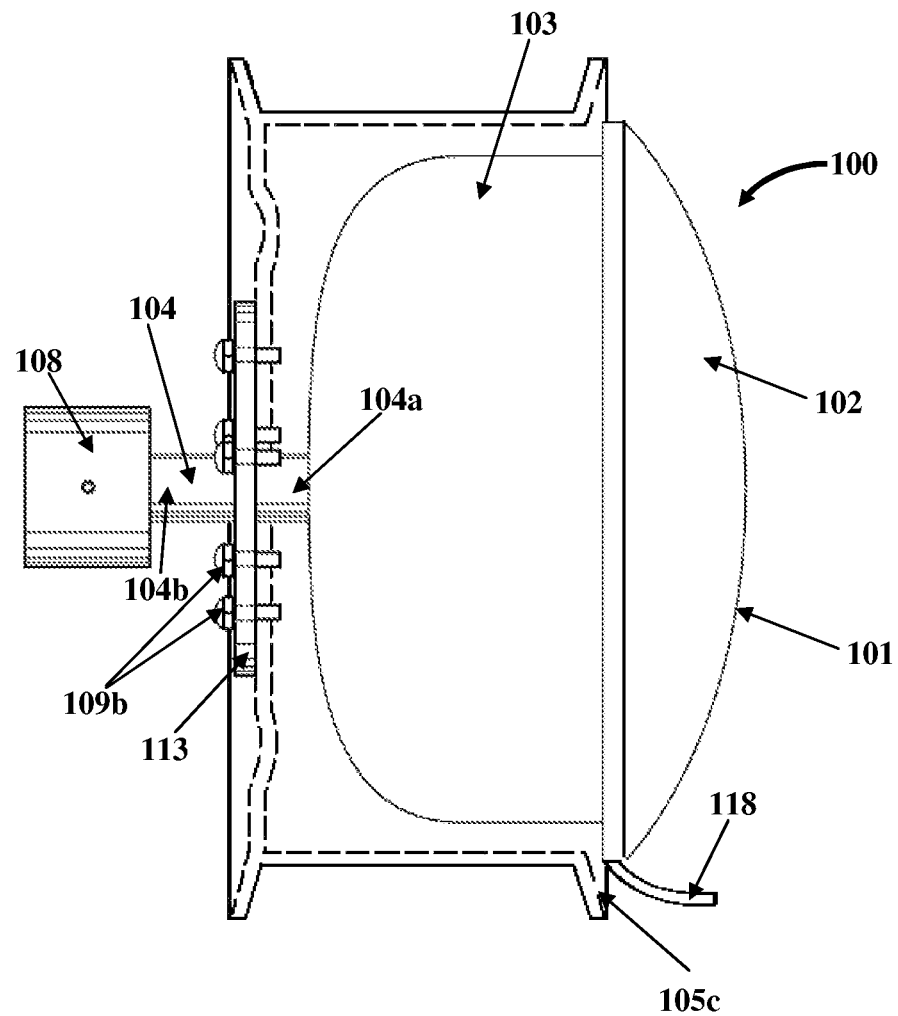
FIG. 15 exemplarily illustrates an embodiment of the solar powered wheel apparatus, showing a reflective mirror disposed proximal to the rotatable element.

FIG. 15 exemplarily illustrates an embodiment of the solar powered wheel apparatus 100, showing a reflective minor 118 disposed proximal to the rotatable element 101. The reflective minor 118 is rigidly connected to and protrudes from the rim 105c of the rotary object 105. The reflective minor 118 directs and concentrates the solar energy on the photovoltaic cells 102 for conversion into electrical energy. The reflective mirror 118 rotates together with the rotary object 105. The arrangement exemplarily illustrated in FIG. 15 creates a more compact structure of the solar powered wheel apparatus 100, while directing the solar energy towards the photovoltaic cells 102.

Figure 16:
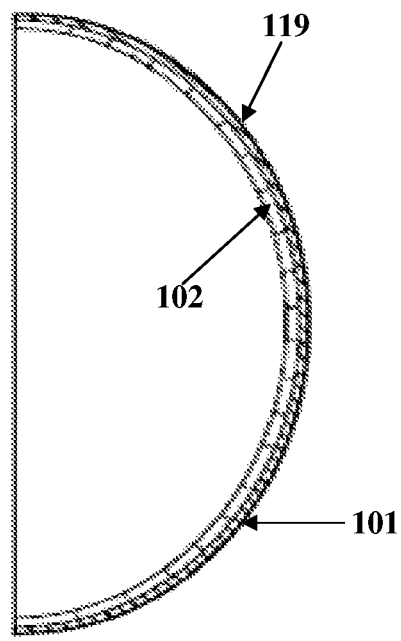
FIG. 16 exemplarily illustrates an embodiment of the solar powered wheel apparatus, showing one or more concentrator lenses disposed on the rotatable element that houses the photovoltaic cells.

FIG. 16 exemplarily illustrates an embodiment of the solar powered wheel apparatus 100, showing one or more concentrator lenses 119 disposed on the rotatable element 101 that houses the photovoltaic cells 102. In this embodiment, the solar powered wheel apparatus 100 further comprises concentrator lenses 119 for concentrating the solar energy on the photovoltaic cells 102 housed on the rotatable element 101. The concentrator lenses 119, for example, Fresnel lenses, are mounted on the photovoltaic cells 102 as exemplarily illustrated in FIG. 16. The concentrator lenses 119 concentrate and direct the solar energy towards the photovoltaic cells 102 for increasing the amount of electrical energy output of the photovoltaic cells 102. The concentrator lenses 119 are made of a substantially transparent material that has a high refractive index such as glass. The high refractive index of the concentrator lenses 119 enables diffraction to occur, where the rays of sunlight are focused to a focal point or region where the photovoltaic cells 102 are located. When the rays of sunlight are focused on the photovoltaic cells 102, the photovoltaic cells 102 receive a greater amount of sunlight and solar energy to convert into electrical energy. This leads to an overall increase in efficiency of the solar powered wheel apparatus 100.

Figure 17:
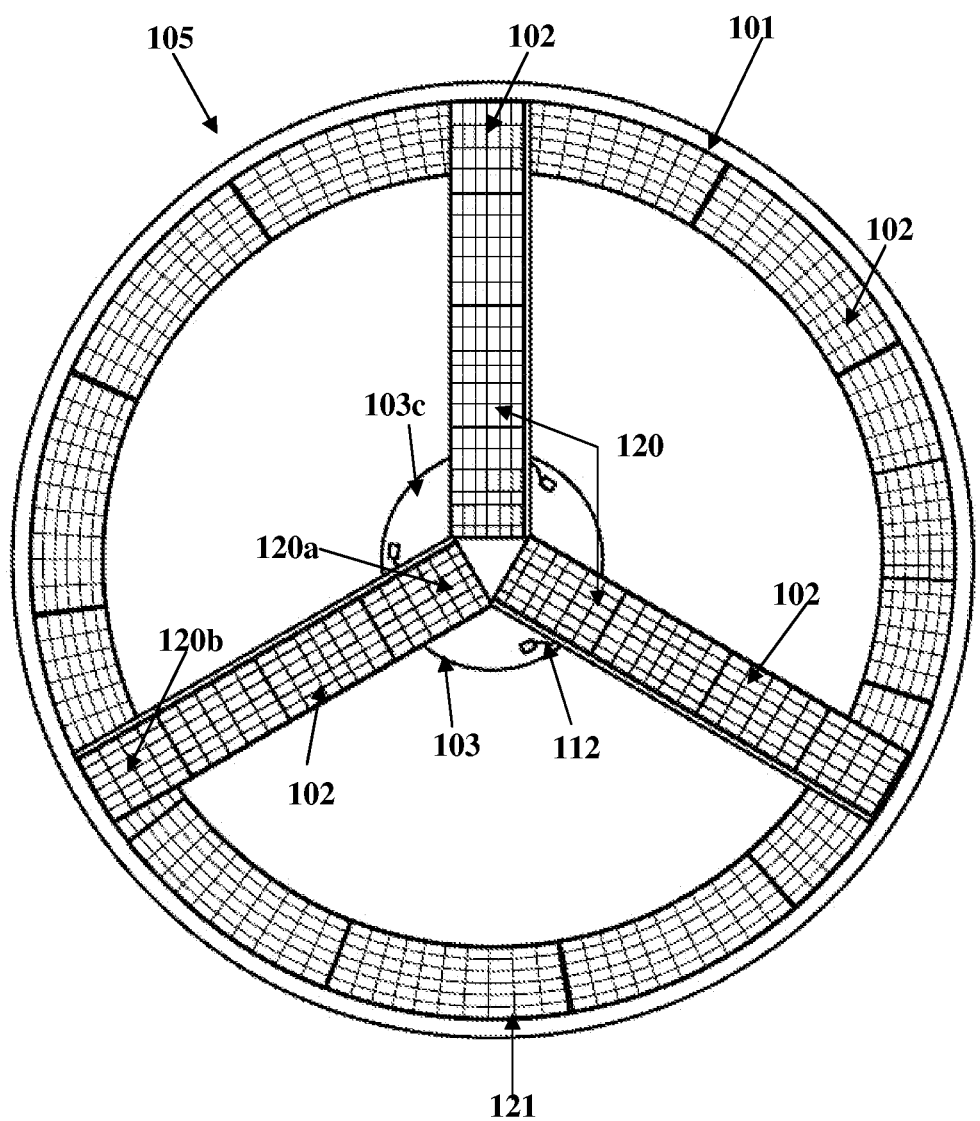
FIG. 17 exemplarily illustrates a top orthogonal view of the solar powered wheel apparatus, showing an embodiment of the rotatable element comprising a ring shaped panel and multiple rectangular panels for housing the photovoltaic cells.

FIG. 17 exemplarily illustrates a top orthogonal view of the solar powered wheel apparatus 100, showing an embodiment of the rotatable element 101 comprising a ring shaped panel 121 and multiple rectangular panels 120 for housing the photovoltaic cells 102. This embodiment may be utilized in a rotary object 105, for example, a rotor of a vehicle, for example, a helicopter 1900 as exemplarily illustrated in FIG. 19. The ring shaped panel 121 and the rectangular panels 120 that house the photovoltaic cells 102 are rigidly connected to the rotary object 105. In this embodiment, each of the rectangular panels 120 of photovoltaic cells 102 radially extends from an upper surface 103c of the electric motor 103 to the ring shaped panel 121 of photovoltaic cells 102. Each of the rectangular panels 120 comprises a first end 120a and a second end 120b. The first end 120a of each of the rectangular panels 120 is electrically connected to the upper surface 103c of the electric motor 103 via leads 112, and the second end 120b of each of the rectangular panels 120 is rigidly connected to the ring shaped panel 121. This configuration of the rotatable element 101 comprising the ring shaped panel 121 and multiple rectangular panels 120 may be connected to pre-existing motors of rotary objects 105, for example, flying toys, rotor 105 of helicopters 1900, etc.

Figure 18:
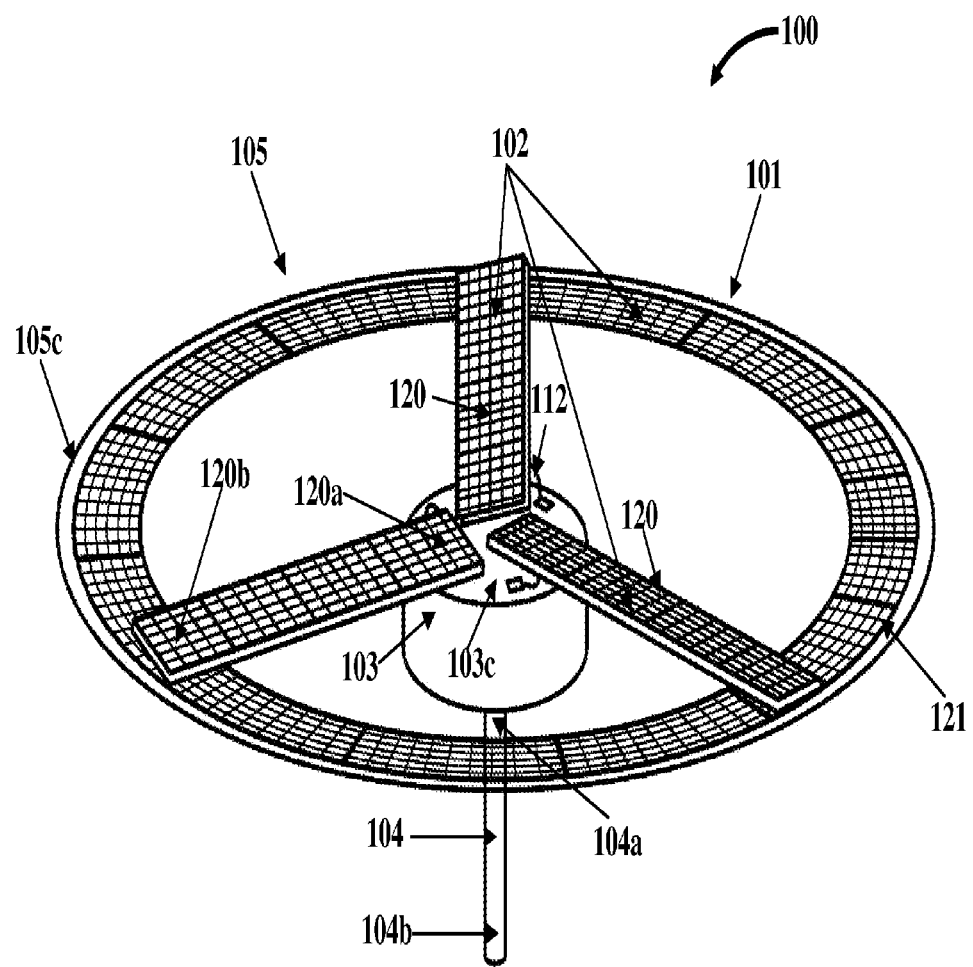
FIG. 18 exemplarily illustrates a top perspective view of the solar powered wheel apparatus, showing an embodiment of the rotatable element comprising a ring shaped panel and multiple rectangular panels for housing the photovoltaic cells.

FIG. 18 exemplarily illustrates a top perspective view of the solar powered wheel apparatus 100, showing an embodiment of the rotatable element 101 comprising the ring shaped panel 121 and multiple rectangular panels 120 for housing the photovoltaic cells 102. The electric terminals 103a and 103b of the electric motor 103 are electrically connected to the first end 120a of the rectangular panels 120 via the leads 112. The axial shaft 104 of the electric motor 103 extends downwardly from the electric motor 103 for connection to a body frame 1901 of a vehicle, for example, a helicopter 1900 as exemplarily illustrated in FIG. 19. This configuration of the rectangular panels 120 connected to the electric motor 103 and to the ring shaped panel 121 may be used in the rotor 105 of the helicopter 1900.

Figure 19:
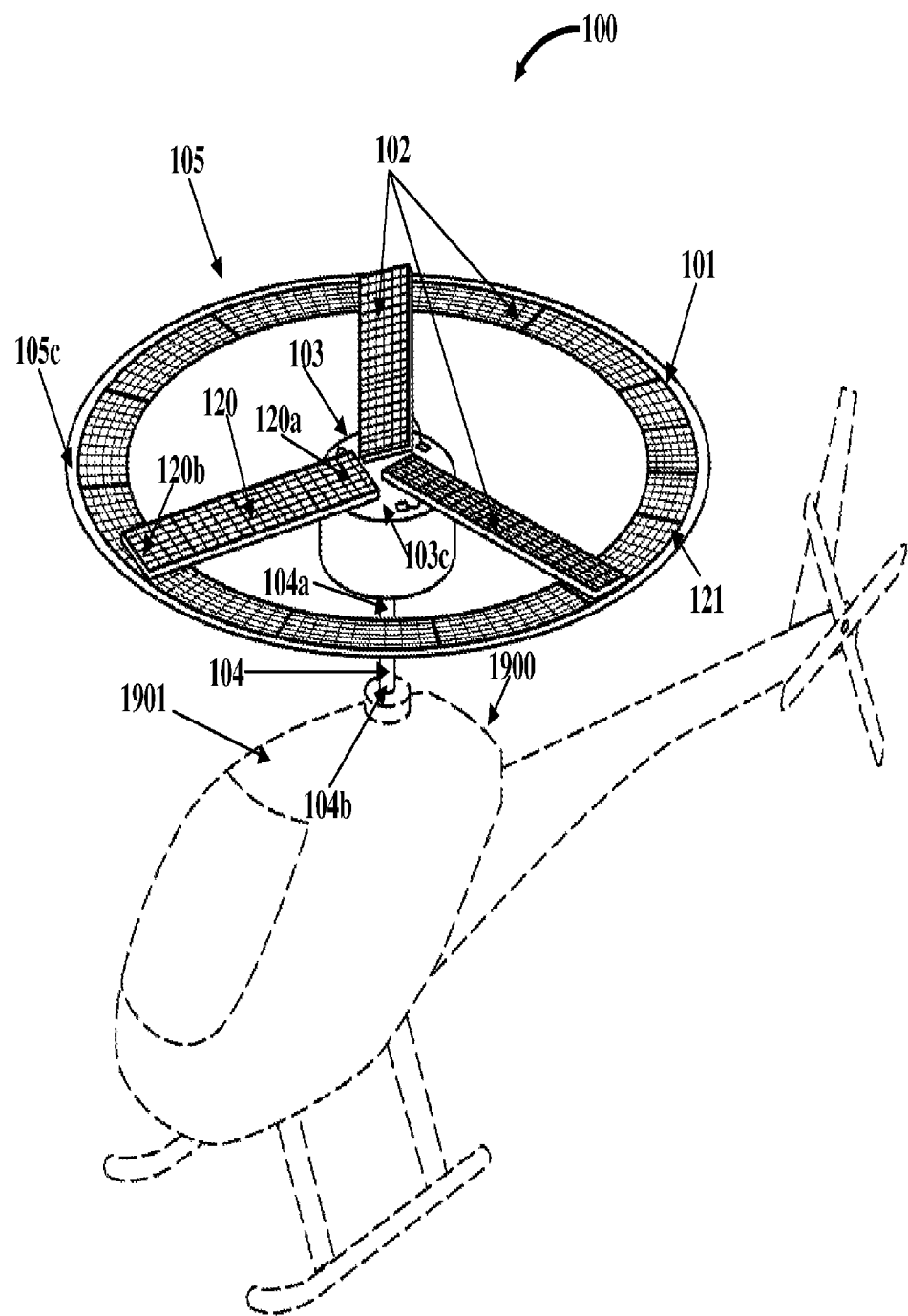
FIG. 19 exemplarily illustrates an embodiment of the rotatable element comprising the ring shaped panel and multiple rectangular panels mounted on a rotor of a helicopter.

FIG. 19 exemplarily illustrates an embodiment of the rotatable element 101 comprising the ring shaped panel 121 and multiple rectangular panels 120 mounted on a rotor 105 of the helicopter 1900. The ring shaped panel 121 is connected to the rim 105c of the rotor 105 of the helicopter 1900. The rectangular panels 120 radially extend from the upper surface 103c of the electric motor 103 to the ring shaped panel 121. The electric motor 103 is rotatably connected to the axial shaft 104. The axial shaft 104 is rigidly connected to the body frame 1901 of the helicopter 1900. The photovoltaic cells 102 on the rectangular panels 120 and the ring shaped panel 121 capture the solar energy from sunlight and convert the captured solar energy into electrical energy. This electrical energy powers the electric motor 103. The electric motor 103 converts the electrical energy into mechanical energy and rotates about the axial shaft 104. The rotation of the electric motor 103 causes the rotor 105 and the rigidly connected rotatable element 101 housing the photovoltaic cells 102 to rotate creating a lift force for the helicopter 1900, while removing heat from the photovoltaic cells 102 due to the rotation of the photovoltaic cells 102, thereby increasing the efficiency of the photovoltaic cells 102.

Figure 20:
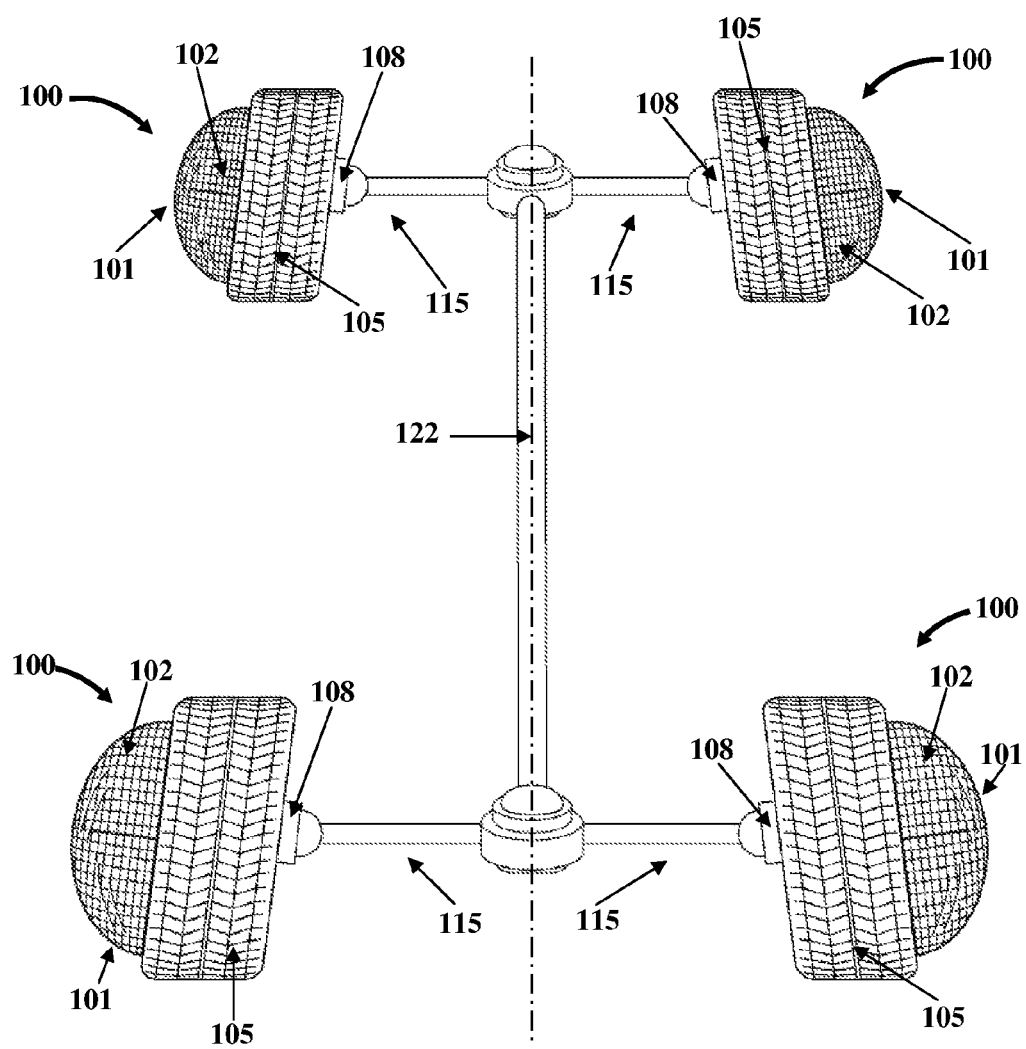
FIG. 20 exemplarily illustrates a top perspective view of a support structure of a car, showing solar powered wheel apparatuses mounted on cambered wheels of the car.

FIG. 20 exemplarily illustrates a top perspective view of a support structure 115, for example, the chassis of a car 900, showing solar powered wheel apparatuses 100 mounted on cambered wheels 105 of the car 900. In this embodiment, the wheels 105 are angled with respect to the longitudinal axis 122 of the car 900, in order to expose the photovoltaic cells 102 to a greater amount of sunlight.

Figure 21:
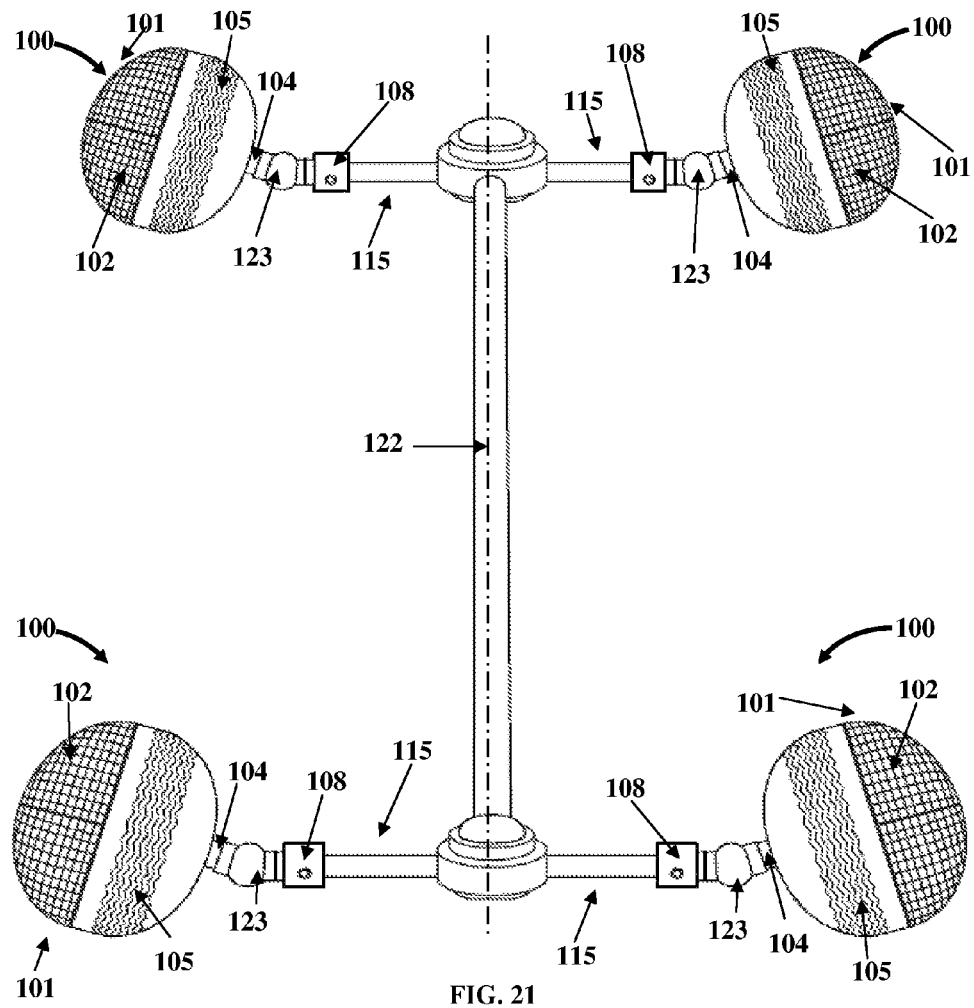
FIG. 21 exemplarily illustrates a top perspective view of the support structure of a car, showing solar powered wheel apparatuses mounted on cambered wheels adjustably connected to the support structure of the car.

FIG. 21 exemplarily illustrates a top perspective view of the support structure 115 of a car 900, showing solar powered wheel apparatuses 100 mounted on cambered wheels 105 adjustably connected to the support structure 115 of the car 900. The adjustable connection allows the wheels 105 of the car 900 to be angled such that, when the car 900 is not propelled by the solar powered wheel apparatuses 100, the photovoltaic cells 102 of the solar powered wheel apparatuses 100 can face towards sunlight to capture solar energy. When the car 900 is in motion, the cambered wheels 105 allow for greater angle of incidence of sunlight. In this embodiment, the adjustable connection is accomplished by connecting a camber element 123 to the axial shaft 104. The camber element 123 allows the wheel 105 of the car 900 to be angled with respect to the longitudinal axis 122 of the car 900.

Figure 22:
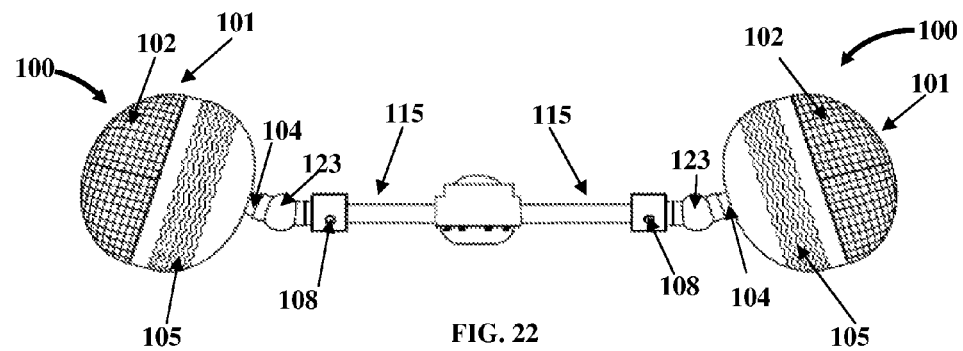
FIG. 22 exemplarily illustrates a front orthogonal view of the support structure of a car, showing solar powered wheel apparatuses mounted on wheels adjustably connected to the support structure of the car.

FIG. 22 exemplarily illustrates a front orthogonal view of the support structure 115 of the car 900, showing solar powered wheel apparatuses 100 mounted on wheels 105 adjustably connected to the support structure 115 of the car 900. When the car 900 is stationary, the wheels 105 may be extended outwardly, for example, using an extendable mechanism, and angled in an upward direction, to expose the photovoltaic cells 102 of each solar powered wheel apparatus 100 to sunlight.

In an embodiment, the rotatable element 101 has a flat pre-drilled flange (not shown) around the periphery of the photovoltaic cells 102. The flange surrounding the photovoltaic cells 102 comprises openings (not shown) which match the openings (not shown) in the rim 105c of the wheel 105. The rotatable element 101 can be fastened to the rim 105c of the wheel 105 through the matching openings, using fasteners. The rotatable element 101 can be unfastened from the rim 105c and removed with the leads 112 connected to the electric motor 103 as exemplarily illustrated in FIG. 7A. The rotatable element 101 may also be reconnected to the rim 105c of the wheel 105 of the car 900 and adjusted to an appropriate angle, for example, via a hinge joint 2801 disclosed in the detailed description of FIG. 28 and FIG. 31B, for exposure to sunlight. When the car 900 is stationary, the rotatable element 101 housing the photovoltaic cells 102 flips out of the rim 105c of the wheel 105 at an angle that provides maximum exposure to sunlight.

Figure 23:
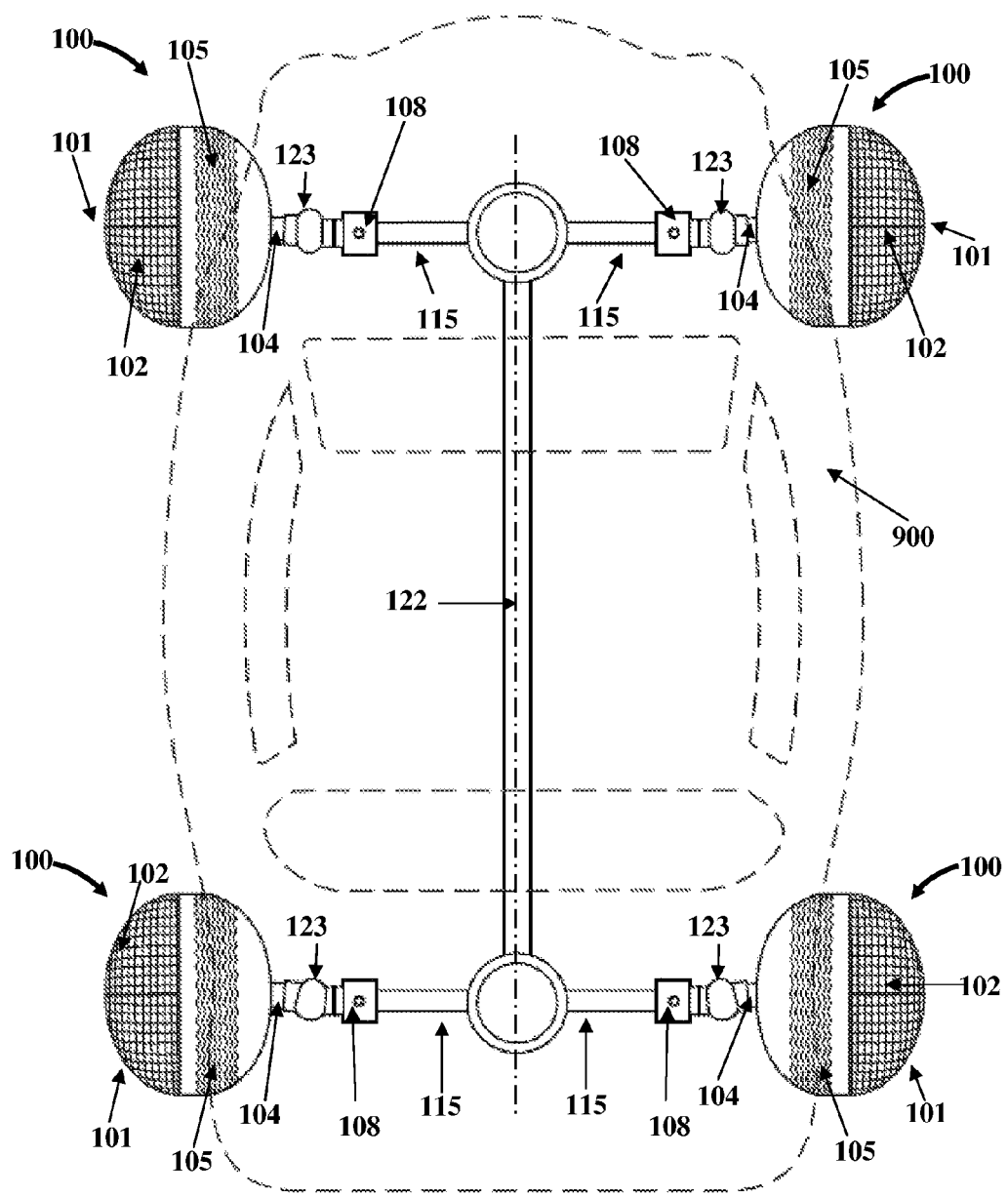
FIG. 23 exemplarily illustrates a top orthogonal view of the support structure of a car, showing solar powered wheel apparatuses mounted on wheels adjustably connected to the support structure of the car.

FIG. 23 exemplarily illustrates a top orthogonal view of the support structure 115 of a car 900, showing solar powered wheel apparatuses 100 mounted on wheels 105 adjustably connected to the support structure 115 of the car 900. In another embodiment, in addition to receiving electrical energy from the rotating photovoltaic cells 102, the electric motor 103 may be fed with electrical energy from other power devices, for example, static photovoltaic devices, wind turbines, combustion engines, laser powered devices, etc., for propelling the car 900.

Figure 24:
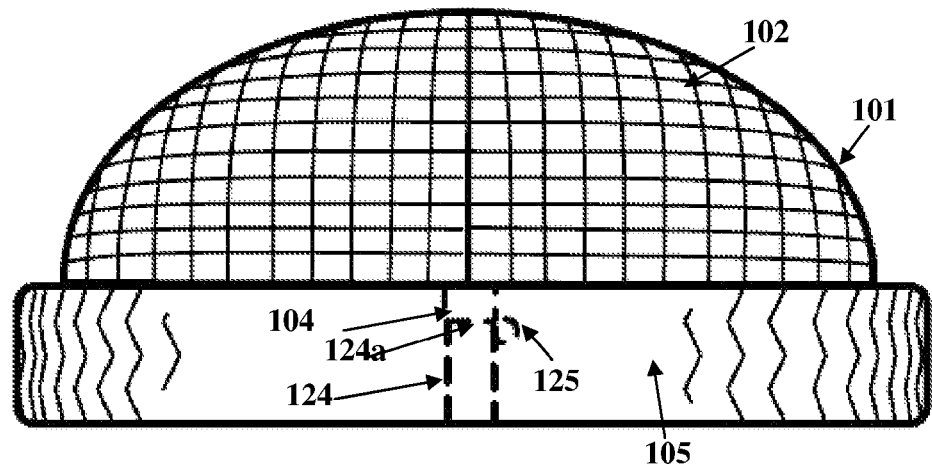
FIGS. 24-25 exemplarily illustrate an embodiment of the solar powered wheel apparatus, showing an extendable hydraulic arm for detaching the rotatable element from the rotary object and angularly displacing the rotatable element via a hinge joint for increasing exposure of the photovoltaic cells housed on the rotatable element to sunlight, when the rotary object is stationary.
Figure 25:
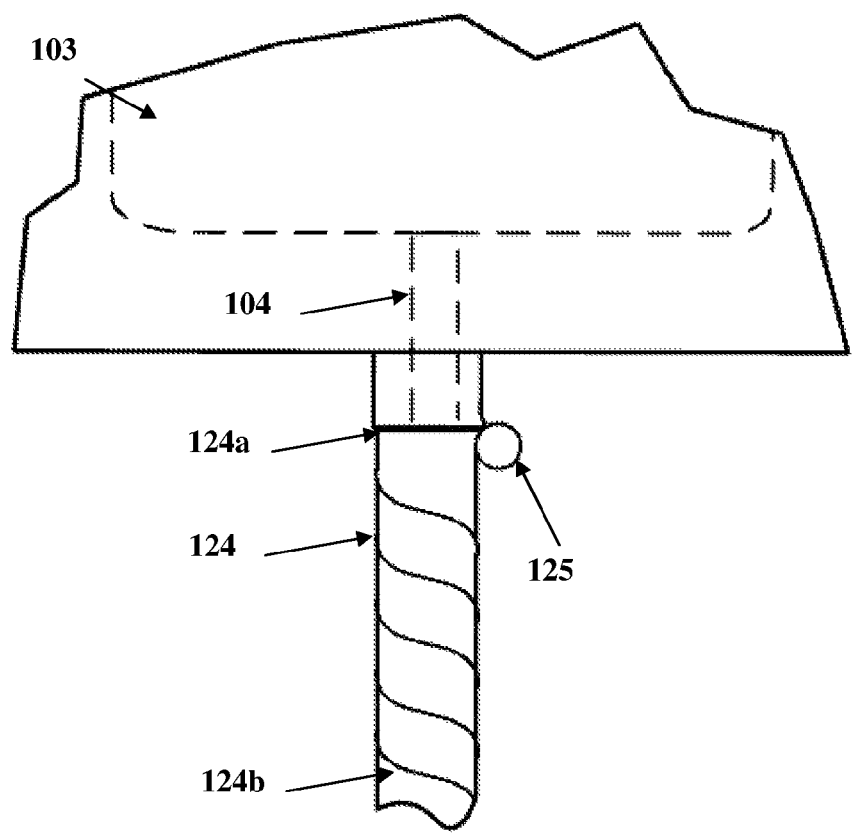

FIGS. 24-25 exemplarily illustrate an embodiment of the solar powered wheel apparatus 100, showing an extendable hydraulic arm 124 for detaching the rotatable element 101 from the rotary object 105 and angularly displacing the rotatable element 101 via a hinge joint 125 for increasing exposure of the photovoltaic cells 102 housed on the rotatable element 101 to sunlight, when the rotary object 105 is stationary. In this embodiment, the extendable hydraulic arm 124 is connected to the support structure 115 of the rotary object 105. A user of the rotary object 105 can control the extendable hydraulic arm 124, for example, using a computer. The extendable hydraulic arm 124 offers better grip and control to the solar powered wheel apparatus 100. The extendable hydraulic arm 124 comprises a first end 124a and a second end 124b. The first end 124a of the extendable hydraulic arm 124 defines the hinge joint 125 for pivotally connecting the rotatable element 101 that houses one or more photovoltaic cells 102 via the axial shaft 104 as exemplarily illustrated in FIG. 24. The second end 124b of the extendable hydraulic arm 124, as exemplarily illustrated in FIG. 25, rigidly connects to the support structure 115 of the rotary object 105. The extendable hydraulic arm 124 is extended from the support structure 115, and the pivotally connected rotatable element 101 is angularly displaced via the hinge joint 125 for increasing exposure of the photovoltaic cells 102 to sunlight. The exposed photovoltaic cells 102 capture additional solar energy and convert the captured solar energy into electrical energy, when the rotary object 105 is stationary.

Figure 26:
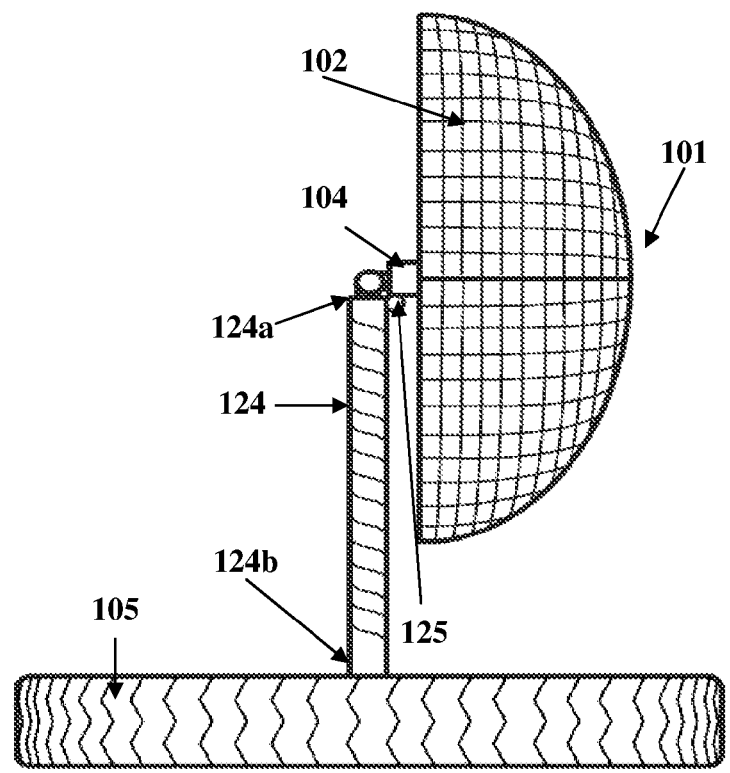
FIGS. 26-27 exemplarily illustrate angular displacement of the rotatable element via the hinge joint for increasing exposure of the photovoltaic cells housed on the rotatable element to sunlight, when the rotary object is stationary.
Figure 27:
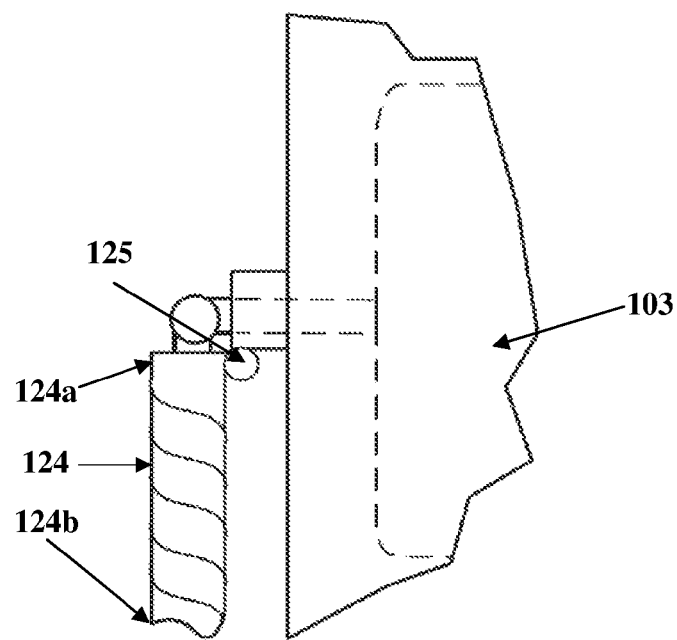

FIGS. 26-27 exemplarily illustrate angular displacement of the rotatable element 101 via the hinge joint 125 for increasing exposure of the photovoltaic cells 102 housed on the rotatable element 101 to sunlight, when the rotary object 105 is stationary. As disclosed in the detailed description of FIGS. 24-25, the rotatable element 101 that houses one or more photovoltaic cells 102 is pivotally connected to the first end 124a of the extendable hydraulic arm 124 via the hinge joint 125 to angularly displace the rotatable element 101 from the rotary object 105 for increasing exposure of the photovoltaic cells 102 to sunlight. The hinge joint 125 is, for example a ball and socket joint. The hinge joint 125 enables the rotatable element 101 to be oriented towards sunlight. The exposed photovoltaic cells 102 capture additional solar energy and convert the captured solar energy into the electrical energy, when the rotary object 105 is stationary. When the rotary object 105 is stationary, the pivotally connected rotatable element 101 is pushed out of the rotary object 105 via the extendable hydraulic arm 124 and oriented in a direction that allows maximum exposure to sunlight. This enables the photovoltaic cells 102 to absorb maximum solar energy and convert the solar energy to electrical energy.

Figure 28:
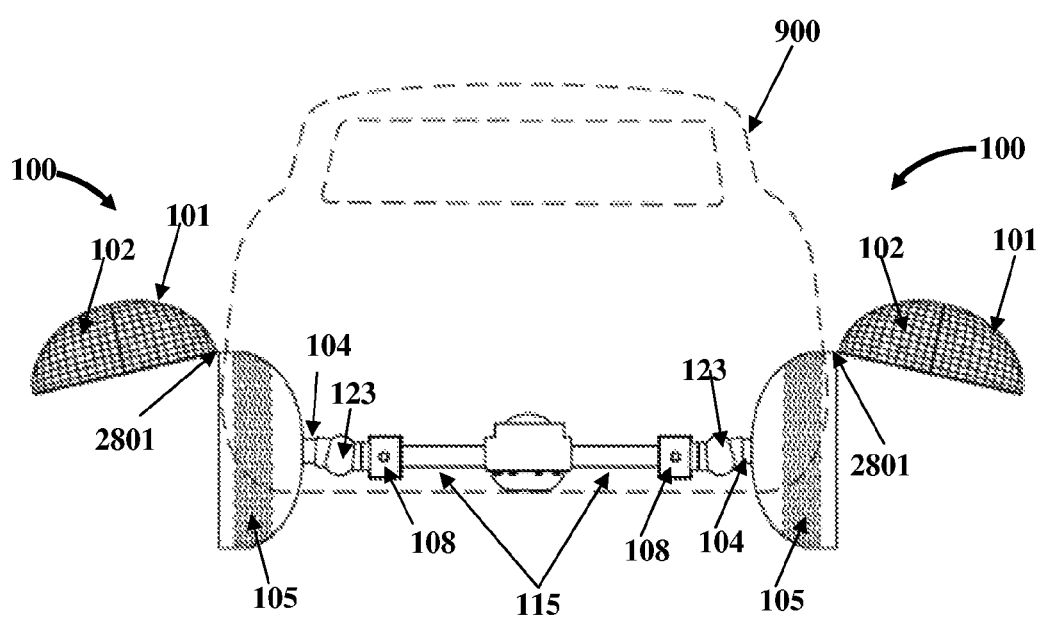
FIG. 28 exemplarily illustrates a front orthogonal view of a car, showing the rotatable element that houses the photovoltaic cells angularly displaced from the wheels of the car.

FIG. 28 exemplarily illustrates a front orthogonal view of a car 900, showing the rotatable element 101 that houses the photovoltaic cells 102 angularly displaced from the wheels 105 of the car 900. In this embodiment, the rotatable element 101 housing the photovoltaic cells 102 is hingedly connected to the rim 105c of the wheel 105 of the car 900. The hingedly connected rotatable element 101 can be angularly displaced about a hinge 2801 for increasing exposure of the photovoltaic cells 102 to sunlight. Thus, the angularly displaced photovoltaic cells 102 can be exposed to more amount of sunlight and the photovoltaic cells 102 can subsequently convert more amount of solar energy from the sunlight into electrical energy when the wheels 105 of the car 900 are not propelled and the car 900 is stationary. In this embodiment, the hingedly connected rotatable element 101 allows a user to detach a part or whole of the photovoltaic cells 102 from the rim 105c of the wheel 105 for purposes of cleaning, oiling, greasing various parts within the rim 105c, or for replacing and repairing the parts within the rim 105c, when the car 900 is stationary.

Figure 29:
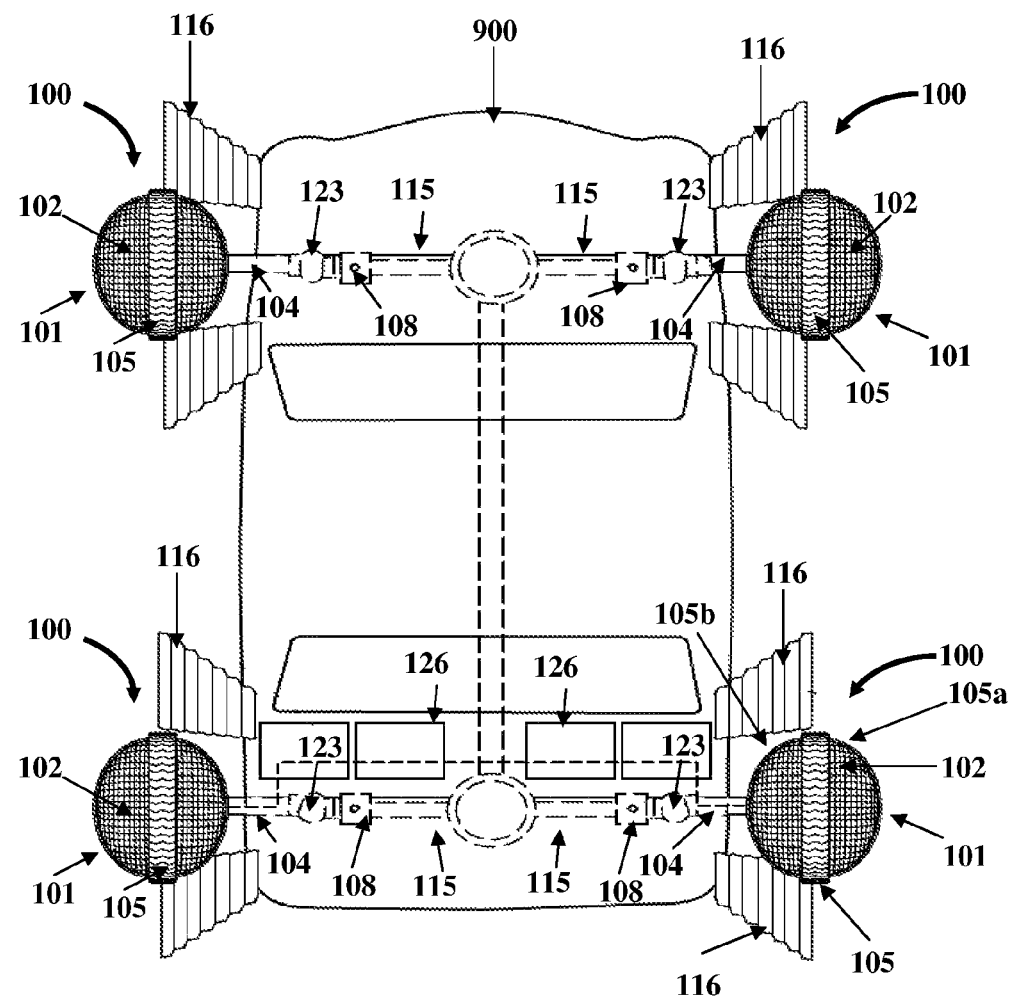
FIG. 29 exemplarily illustrates a top orthogonal view of a car, showing solar powered wheel apparatuses with rotatable elements disposed on opposing sides of the wheels of the car.

FIG. 29 exemplarily illustrates a top orthogonal view of a car 900, showing solar powered wheel apparatuses 100 with rotatable elements 101 disposed on opposing sides 105a and 105b of the wheels 105 of the car 900. A rotatable element 101 that houses one or more photovoltaic cells 102 is disposed on each of the opposing sides 105a and 105b of each wheel 105 of the car 900. The wheels 105 are adjustably connected to the support structure 115 of the car 900 via the camber elements 123. The axial shaft 104 of each electric motor 103 is rigidly connected to the support structure 115. Each of the photovoltaic cells 102 disposed on opposing sides 105a and 105b of the wheels 105 capture solar energy and convert the solar energy into electrical energy. The photovoltaic cells 102 disposed on the opposing sides 105a and 105b of the wheel 105 capture additional solar energy and increase the efficiency of the car 900. Additional attachments, for example, reflectors 116 or lenses 119 increase exposure of the photovoltaic cells 102 to a greater amount of sunlight. This increase in exposure to sunlight and operation of the photovoltaic cells 102 at lower temperatures increases the overall efficiency of the solar powered wheel apparatus 100. The reflectors 116 are positioned proximal to the photovoltaic cells 102, for example, using fasteners. The reflectors 116 increase the electrical output of the photovoltaic cells 102 and in turn improve the overall efficiency of the solar powered wheel apparatus 100.

In another embodiment, the solar powered wheel apparatus 100 further comprises one or more energy storage devices 126, for example, batteries disposed within the support structure 115 of the car 900. The energy storage devices 126 are in electric communication with the photovoltaic cells 102 on the rotatable element 101 for storing electrical energy produced by the photovoltaic cells 102.

Figure 30:
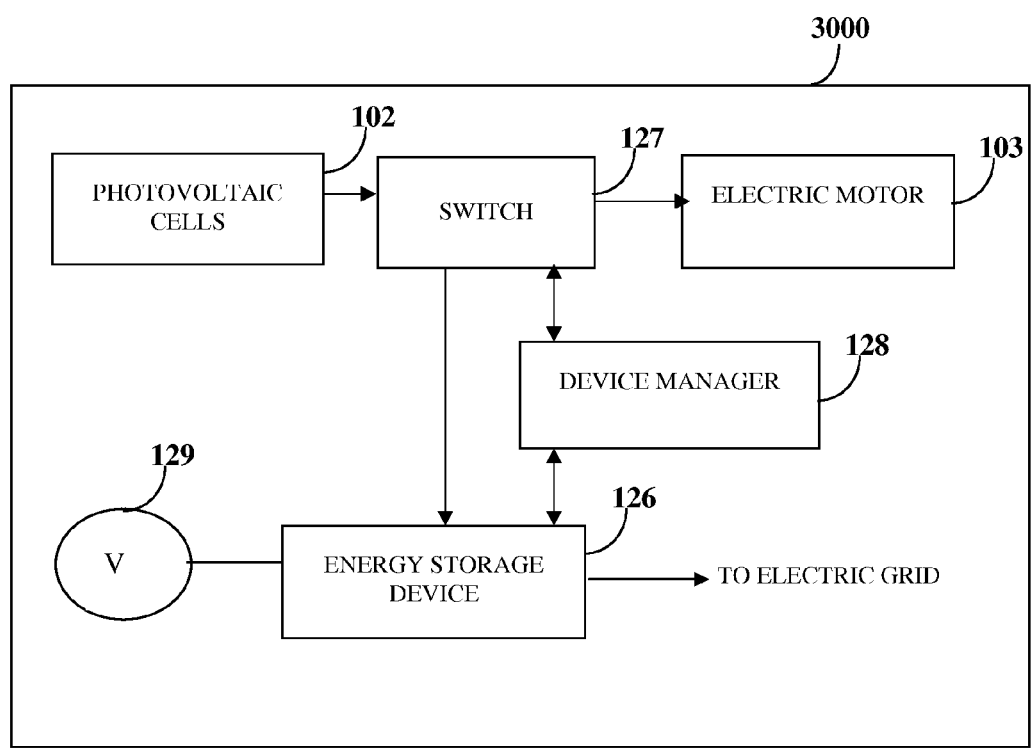
FIG. 30 exemplarily illustrates a block diagram representation of a system for transferring electrical energy produced by the photovoltaic cells on the rotatable element of the solar powered wheel apparatus to an energy storage device and the electric motor.

FIG. 30 exemplarily illustrates a block diagram representation of a system 3000 for transferring electrical energy produced by the photovoltaic cells 102 on the rotatable element 101 of the solar powered wheel apparatus 100 to an energy storage device 126 and the electric motor 103. A switch 127 is used to break an electrical circuit for interrupting the electrical energy, for example, current or for diverting the electrical energy from the photovoltaic cells 102 to the energy storage device 126 or from the energy storage device 126 to the electric motor 103. In the presence of sunlight, the switch 127 may be configured to transfer the electrical energy obtained from the photovoltaic cells 102 to the electric motor 103 and also to the energy storage device 126, thereby charging the energy storage device 126. In the absence of sunlight, the switch 127 may be configured to transfer the electrical energy stored in the charged energy storage device 126 to the electric motor 103. When the vehicle, for example, 900, 3500, 3900, 4000, 4100, 4200, 4300, etc., is stationary, the solar powered wheel apparatus 100 in the wheel 105 can be used to recharge the energy storage device 126. The energy storage device 126 thereby stores the electrical energy produced by the photovoltaic cells 102 and transfers the stored electrical energy to the electric motor 103 via the switch 127.

In an embodiment, the transfer of electrical energy from the photovoltaic cells 102 to the electric motor 103 through slip rings 107 is controlled electronically, for example, using a microprocessor controlled computer system. The slip rings 107 are in electric communication with the photovoltaic cells 102 on the rotatable element 101, the energy storage device 126, and the electric motor 103 for transferring the electrical energy produced by the photovoltaic cells 102 to the energy storage device 126 for storage of the electrical energy, and for enabling transfer of the stored electrical energy from the energy storage device 126 to the electric motor 103. Furthermore, the slip rings 107 are utilized for transferring power equally between multiple interconnected wheels 105. In a hybrid application, the electrical energy in the form of voltage rises steadily until a recharging limit is reached. A voltmeter 129 measures the value of voltage stored in the energy storage device 126 and displays the value to a user of the vehicle 900, 3500, 3900, 4000, 4200, 4300, etc., or the rotary object 105. The user is therefore informed of the amount of electrical energy stored in the energy storage device 126 and the status of powering of the electric motor 103 by the photovoltaic cells 102 or from the energy storage device 126. The electrical energy stored in the energy storage device 126 may be used to transfer power back to an electrical grid. A device manager 128 manages the transfer of electrical energy from the photovoltaic cells 102 to the energy storage device 126 and to the electric motor 103 via the switch 127. When the vehicle, for example, 900, 3500, 3900, 4000, 4200, 4300, etc., is stationary, the electrical energy is stored in the energy storage device 126 without loss of energy.

During operation, when the rotatable element 101 housing the photovoltaic cells 102 rotates, the slip ring 107 mounted on the axial shaft 104 facilitates transfer of electrical energy from the photovoltaic cells 102 to the energy storage device 126. When the rotatable element 101 is stationary, the electrical energy that is available in the energy storage device 126 is transferred to the electric motor 103 through the slip ring 107. Therefore, the slip ring 107 facilitates bidirectional transfer of power from the photovoltaic cells 102 to the energy storage device 126 when the rotatable element 101 housing the photovoltaic cells 102 rotates continuously, and from the energy storage device 126 to the electric motor 103 when the rotatable element 101 is stationary. Although the slip rings 107 facilitate bidirectional transfer of energy, the electrical energy flows in a direction to serve the requirements of a user. For example, electrical energy flows from the photovoltaic cells 102 on the rotating element 101 to the electric motor 103, or from the energy storage device 126 to the electric motor 103, or from the photovoltaic cells 102 to the energy storage device 126, for example, by the switch 127, diodes, etc.

Figure 31A:
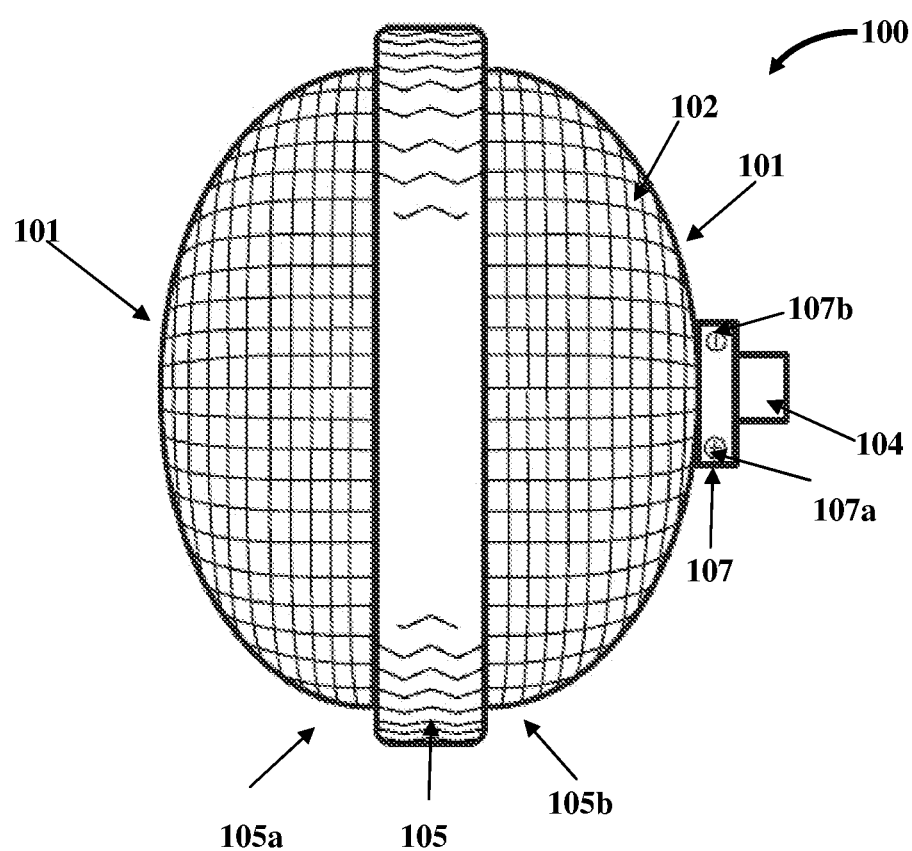
FIG. 31A exemplarily illustrates a side orthogonal view of an embodiment of the solar powered wheel apparatus, showing a rotatable element that houses photovoltaic cells disposed on opposing sides of the wheel.

FIG. 31A exemplarily illustrates a side orthogonal view of an embodiment of the solar powered wheel apparatus 100, showing a rotatable element 101 that houses photovoltaic cells 102 disposed on opposing sides 105a and 105b of the wheel 105. The solar powered wheel apparatus 100 comprises the slip ring 107 in electric communication with the photovoltaic cells 102 disposed on the opposing sides 105a and 105b of the wheel 105. The slip ring 107 is mounted on and insulated from the axial shaft 104. During operation, when the rotatable element 101 housing the photovoltaic cells 102 rotates, the slip ring 107 facilitates transfer of electrical energy from the photovoltaic cells 102 to the energy storage device 126 as disclosed in the detailed description of FIG. 2. In an embodiment, the slip rings 107 are used to transfer electrical energy from one rotatable element 101 housing the photovoltaic cells 102 on one opposing side 105a of the wheel 105 to the electric motor 103 in electric communication with the photovoltaic cells 102 of the rotatable element 101 on the other opposing side 105b of the wheel 105.

Figure 31B:
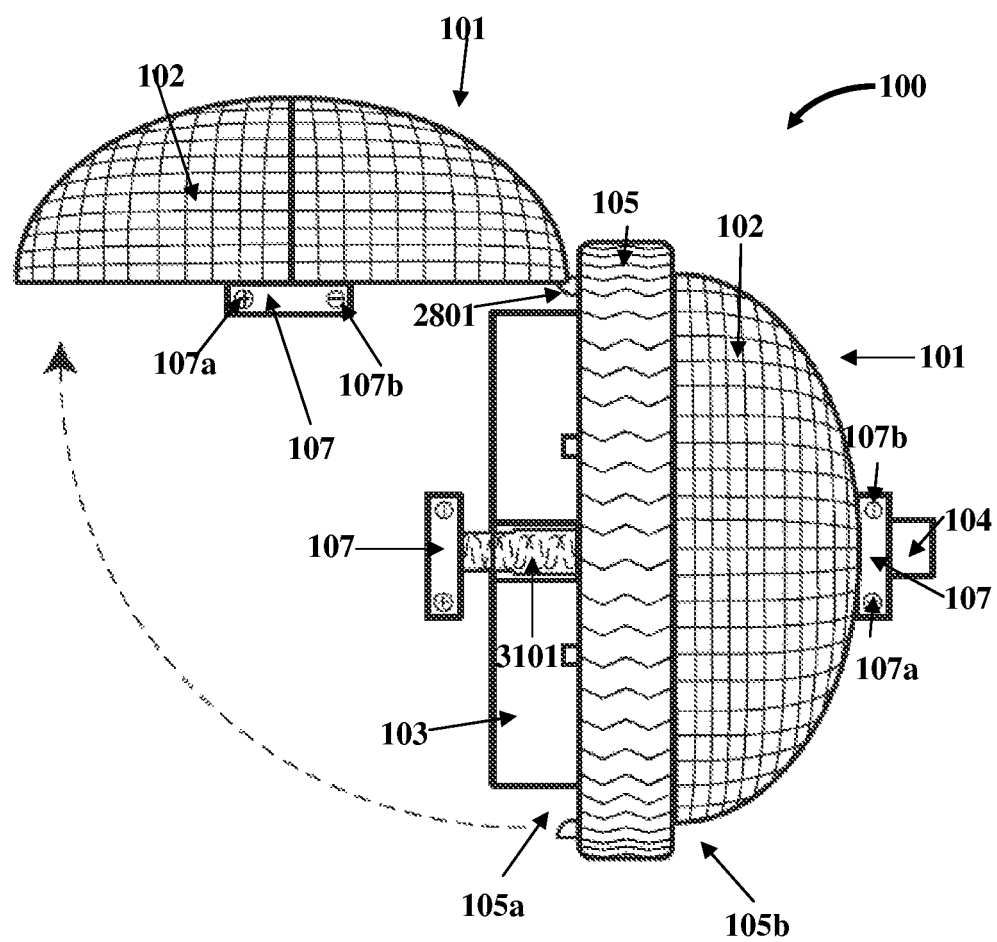
FIG. 31B exemplarily illustrates a side orthogonal view of an embodiment of the solar powered wheel apparatus, showing angular displacement of a rotatable element from one opposing side of the wheel.

FIG. 31B exemplarily illustrates a side orthogonal view of an embodiment of the solar powered wheel apparatus 100, showing angular displacement of a rotatable element 101 from one opposing side 105a of the wheel 105. In order to increase exposure of the photovoltaic cells 102 to sunlight when the vehicle, for example, 900, 3500, 3900, 4000, 4200, 4300, etc., is stationary, the rotatable element 101 housing the photovoltaic cells 102 on one opposing side 105a of the wheel 105 is angularly displaced from the wheel 105, for example, via a hinge 2801. A slip ring 107 is rigidly connected to the rotatable element 101 on one opposing side 105a of the wheel 105. The rigidly connected slip ring 107 connects to additional slip rings 107 mounted on the axial shaft 104, for example, by spirally coiled wires 3101 disposed in the axial shaft 104.

The slip rings 107 are used for transferring electrical energy produced by the photovoltaic cells 102 on opposing sides 105a and 105b of the wheel 105 to the electric motor 103 and/or the energy storage device 126 provided in the vehicle, for example, 900, etc. When the angularly displaced rotatable element 101 on one opposing side 105a of the wheel 105 is rejoined to the wheel 105, the rigidly connected slip ring 107 on one opposing side 105a of the wheel 105 transfers the electrical energy from the rejoined rotatable element 101 to the electric motor 103, via the slip rings 107 mounted on the axial shaft 104 using the spirally coiled electrical wires 3101 disposed in the axial shaft 104. The electrical energy is also transferred to the energy storage devices 126 exemplarily illustrated in FIG. 29 through the connections of the slip rings 107 via the wires 3101. The electrical energy can then be fed from the energy storage devices 126 to the electric motor 103 via the slip rings 107. In an embodiment, the angularly displaced rotatable element 101 on one opposing side 105a of the wheel 105 can be removed from the wheel 105, while retaining the other rotating element 101 on the other opposing side 105b of the wheel 105.

Figure 32:
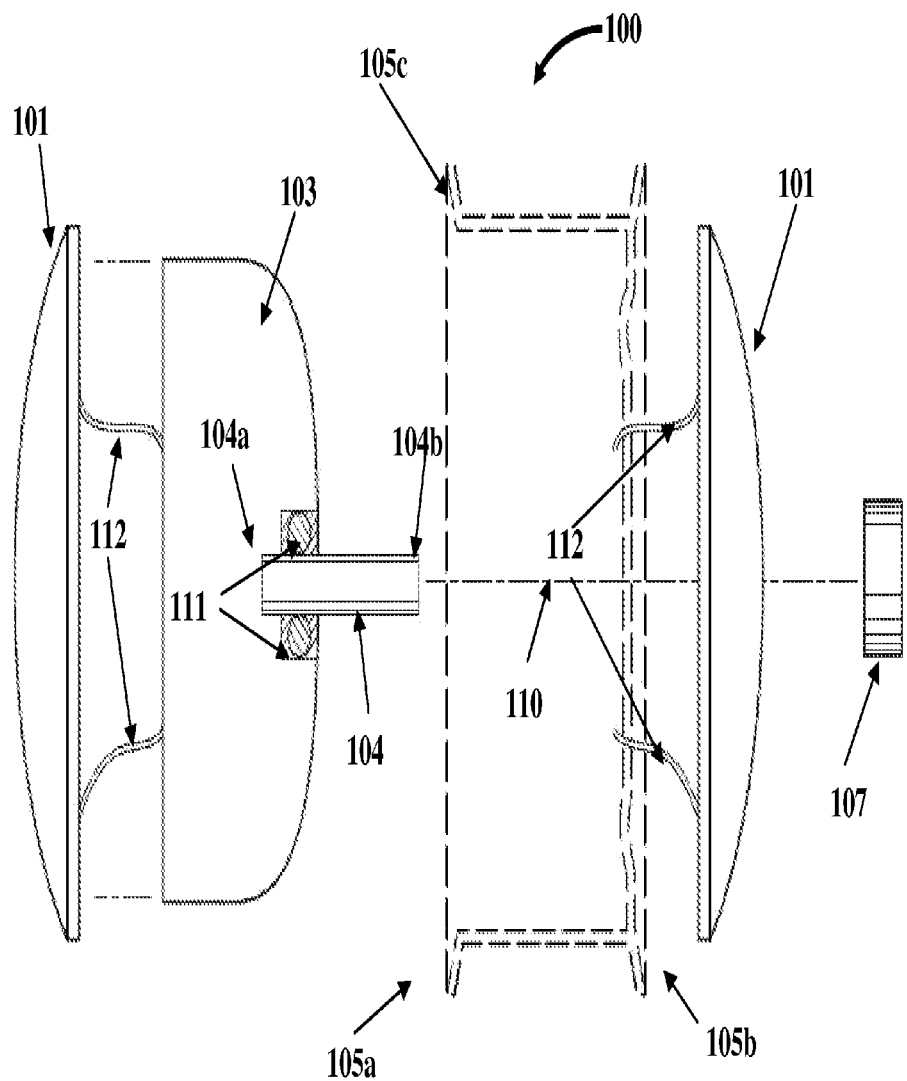
FIG. 32 exemplarily illustrates an exploded view of an embodiment of the solar powered wheel apparatus with rotatable elements disposed on opposing sides of the wheel.

FIG. 32 exemplarily illustrates an exploded view of an embodiment of the solar powered wheel apparatus 100 with rotatable elements 101 disposed on opposing sides 105a and 105b of the wheel 105. A rotatable element 101 housing the photovoltaic cells 102 is disposed on each of the opposing sides 105a and 105b of the wheel 105. The electric motor 103 is in electric communication with the photovoltaic cells 102 that power the electric motor 103, for example, via the leads 112. The electric motor 103 is also rigidly connected to the rotatable element 101 that houses the photovoltaic cells 102. The axial shaft 104 is rotatably connected to the electric motor 103, for example, by bearings 111, and is rigidly connected to the support structure 115 of the rotary object 105 as exemplarily illustrated in FIG. 23 and FIG. 29. The bearings 111 allow the electric motor 103 to rotate about the axial shaft 104. The bearings 111 are, for example, ball bearings. The slip rings 107 are in electric communication with the electric motor 103 and are mounted on the axial shaft 104. The slip rings 107 facilitate transfer of electrical energy from the photovoltaic cells 102 to the electric motor 103 and/or the energy storage device 126 through the axial shaft 104.

Figure 33:
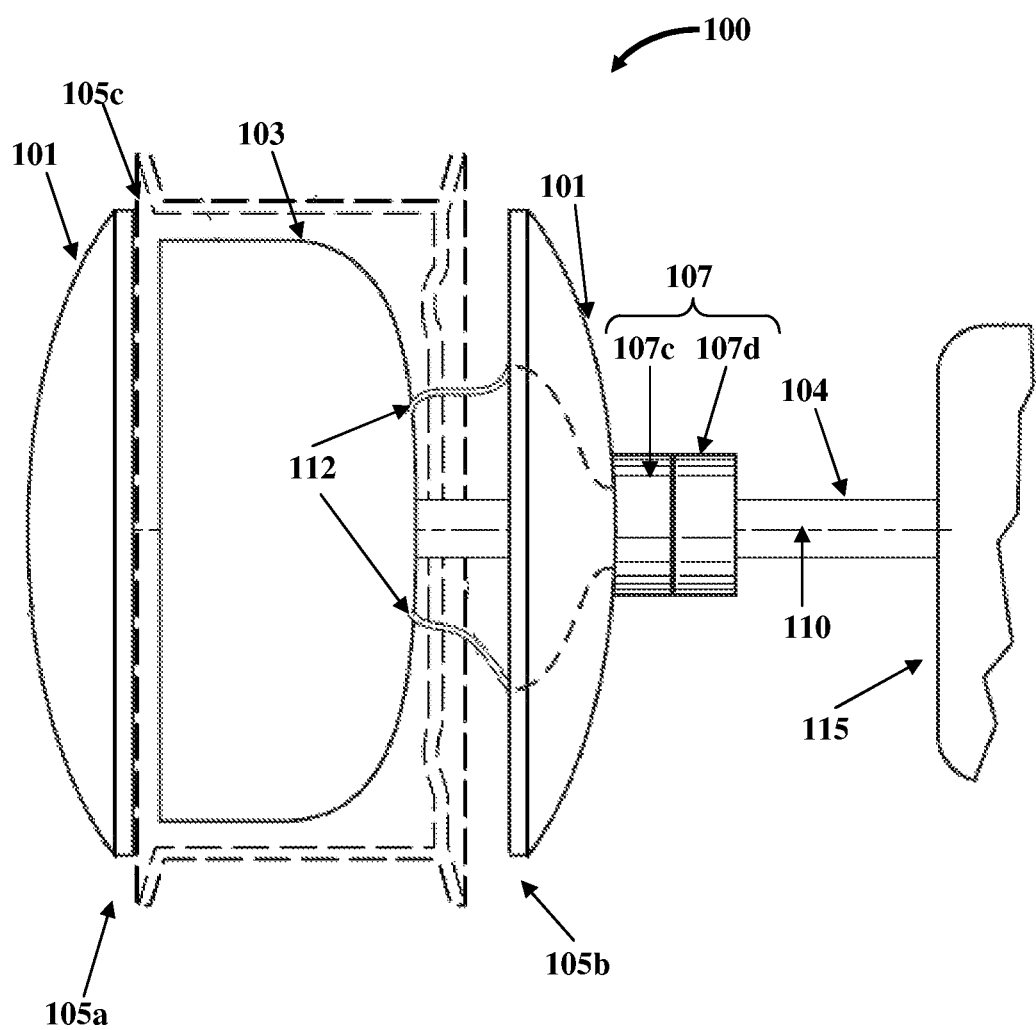
FIG. 33 exemplarily illustrates a side assembled view of the solar powered wheel apparatus with rotatable elements disposed on opposing sides of the wheel.

FIG. 33 exemplarily illustrates a side assembled view of the solar powered wheel apparatus 100 with rotatable elements 101 disposed on opposing sides 105a and 105b of the wheel 105. FIG. 33 shows the electric motor 103 mounted within the rim 105c of the wheel 105. The rotatable element 101 on one opposing side 105a of the wheel 105 is outwardly exposed to sunlight. The rotatable element 101 on the other opposing side 105b of the wheel 105 is connected to the support structure 115 of the vehicle, for example, 900, etc., via the axial shaft 104. Slip rings 107 are mounted on the axial shaft 104. The slip rings 107 comprise a positive electric terminal 107a and a negative electric terminal 107b and are in series with the positive electric terminal 103a and the negative electric terminal 103b of the electric motor 103 respectively. During operation, the series arrangement of the terminals 103a, 103b, and 107a, 107b of the electric motor 103 and the slip rings 107 respectively facilitate bidirectional transfer of electrical energy from the photovoltaic cells 102 on the rotatable elements 101 to the electric motor 103 and/or the energy storage device 126 and from the energy storage device 126 to the electric motor 103. The slip ring 107c rigidly connected to the rotatable element 101 on the opposing side 105b of the wheel 105 rotates along with the rotatable element 101, while the slip ring 107d rigidly connected to the axial shaft 104 remains stationary.

Figure 34:
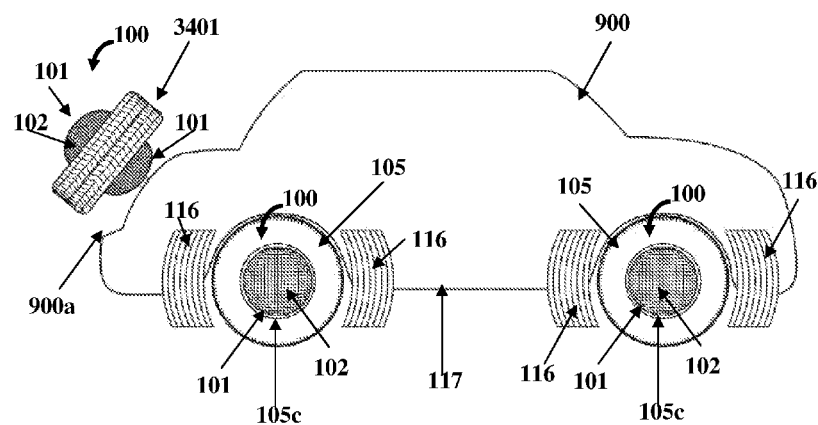
FIG. 34 exemplarily illustrates a side orthogonal view of a car, showing solar powered wheel apparatuses mounted on the wheels of the car and on an additional unused wheel of the car.

FIG. 34 exemplarily illustrates a side orthogonal view of a car 900, showing solar powered wheel apparatuses 100 mounted on the wheels 105 of the car 900 and on an additional unused wheel 3401 of the car 900. The solar powered wheel apparatus 100 is mounted on the unused wheel 3401 of the car 900, which can be used when the used wheels 105 suffer a flat. The unused wheel 3401 containing the photovoltaic cells 102 on the rotatable elements 101 are exposed to sunlight at the rear end 900a of the car 900 to allow conversion of solar energy to electrical energy and storage of the electrical energy for later use. When a wheel 105 suffers a flat, the wheel 105 is replaced with the unused wheel 3401 containing the solar powered apparatus 100 disposed on the rear end 900a of the car 900. This allows the car 900 to resume a journey without any loss of time. Additional attachments, for example, the reflectors 116 or the lenses 119 mounted on the body frame 117 of the car 900 adjacent to the wheels 105 cause the photovoltaic cells 102 to be exposed to a greater amount of solar energy. This increase in exposure to sunlight and the operation of the photovoltaic cells 102 at lower temperatures increases the overall efficiency of the solar powered wheel apparatus 100.

Figure 35:
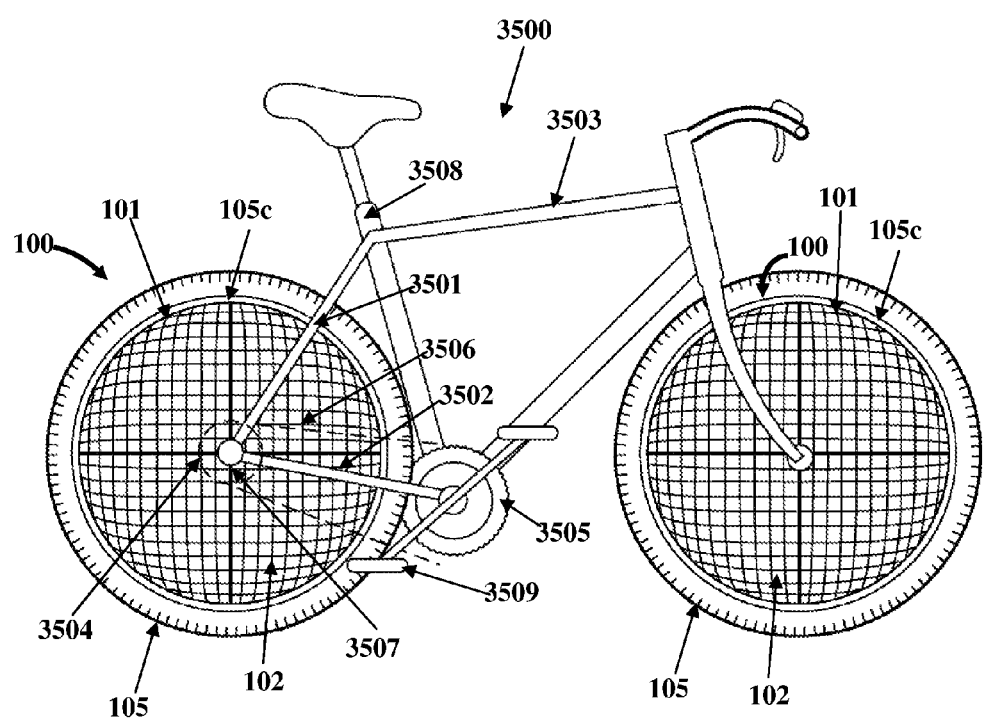
FIG. 35 exemplarily illustrates a side orthogonal view of a bicycle, showing solar powered wheel apparatuses mounted on the wheels of the bicycle.

FIG. 35 exemplarily illustrates a side orthogonal view of a bicycle 3500, showing solar powered wheel apparatuses 100 mounted on the wheels 105 of the bicycle 3500. In this embodiment, the solar powered wheel apparatus 100 comprising one or more photovoltaic cells 102 housed on the rotatable element 101, the electric motor 103, and the axial shaft 104 is provided on the wheels 105 of the bicycle 3500. The photovoltaic cells 102 capture solar energy and convert the solar energy into electrical energy. The rotatable element 101 is rigidly connected to the wheels 105 of the bicycle 3500. The electric motor 103 is in electric communication with the photovoltaic cells 102 that power the electric motor 103 and is rigidly connected to the rotatable element 101 that houses the photovoltaic cells 102 as exemplarily illustrated in FIG. 36. The axial shaft 104 is rotatably connected to the electric motor 103 and rigidly connected to, for example, a wheel hub 3507 of the bicycle 3500. A seat stay 3501 and a chain stay 3502 of the bicycle 3500 connected to the tube frame 3503 of the bicycle 3500 are rigidly connected to the axial shaft 104 of the solar powered wheel apparatus 100. The chain stay 3502 is a hollow metallic rod that connects a freewheel 3504 to a chain wheel 3505. The seat stay 3501 is a hollow metallic rod that connects the freewheel 3504 to a seat post 3508 of the bicycle 3500. The freewheel 3504 is a driven wheel that is smaller in diameter and is rotatably supported by the axial shaft 104. The chain wheel 3505 is the driver wheel and is rotatably supported by a pedal 3509. The chain wheel 3505 is larger in diameter than the freewheel 3504. A bicycle chain 3506 is rotatably driven around the freewheel 3504 and the chain wheel 3505.

Figure 36:
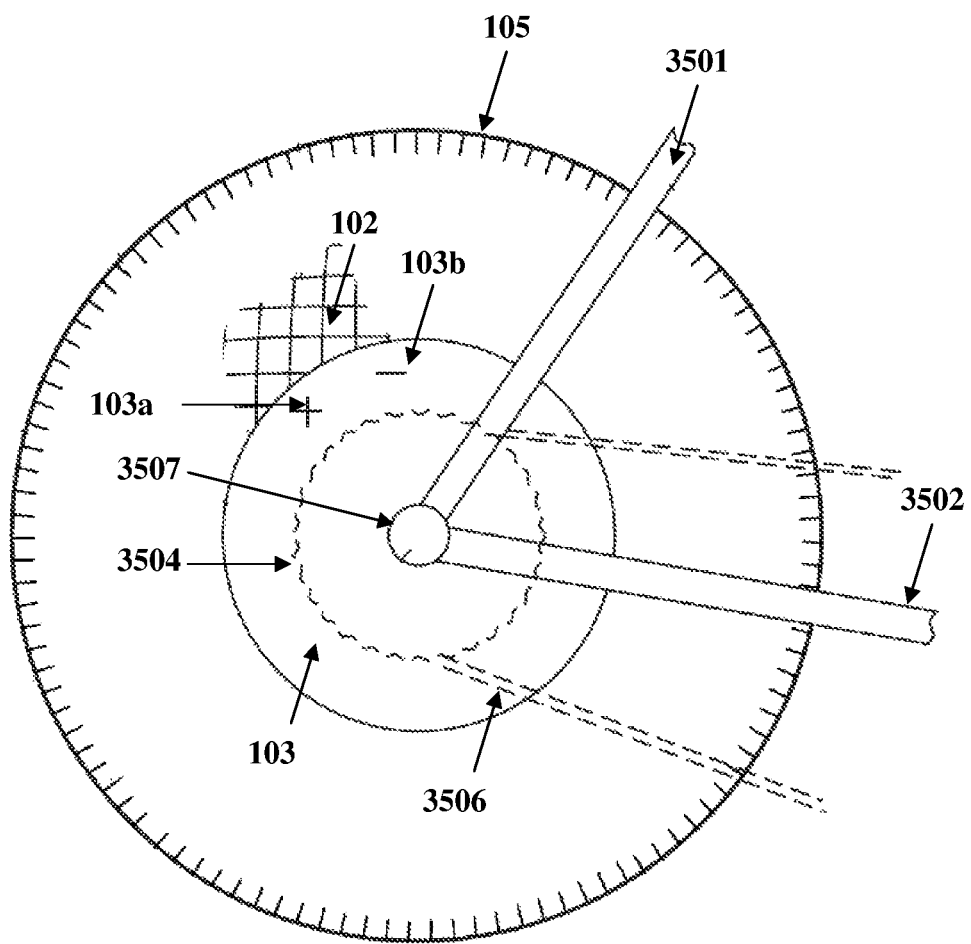
FIG. 36 exemplarily illustrates a rear orthogonal view of the solar powered wheel apparatus mounted on a wheel of a bicycle.

FIG. 36 exemplarily illustrates a rear orthogonal view of the solar powered wheel apparatus 100 mounted on a wheel 105 of the bicycle 3500. The rotatable element 101 is disposed on one or both opposing sides 105a and 105b of the wheel 105 of the bicycle 3500. FIG. 36 shows the electric connection of the electric terminals 103a and 103b of the electric motor 103 to the photovoltaic cells 102. The axial shaft 104 protrudes perpendicularly from the hub 3507 of a rear wheel 105 of the bicycle 3500 and rigidly connects the rotatable element 101 housing the photovoltaic cells 102 to the rear wheel 105. The photovoltaic cells 102 capture solar energy and convert the solar energy into electrical energy, which powers the electric motor 103. The electric motor 103 converts the electrical energy produced by the photovoltaic cells 102 into mechanical energy and rotates about the axial shaft 104. The rotation of the electric motor 103 rotates the rigidly connected rotatable element 101 that houses the photovoltaic cells 102. The rotation of the rotatable element 101 housing the photovoltaic cells 102 removes heat from the photovoltaic cells 102 and causes rotation of the connected wheel 105. During operation, as the wheel 105 rotates, the effort required by a rider of the bicycle 3500 is reduced and the bicycle 3500 moves forward without any strain on the rider. During operation, when a user pedals the bicycle 3500, the power from the chain wheel 3505 is transferred to the freewheel 3504 through the bicycle chain 3506 and the bicycle 3500 moves forward.

Figure 37:
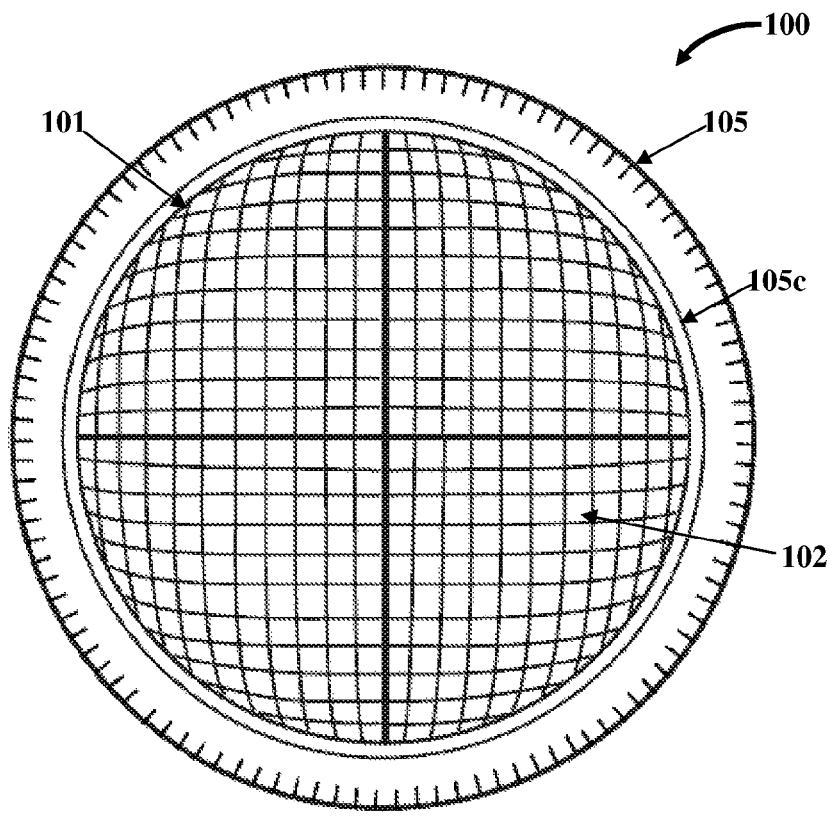
FIG. 37 exemplarily illustrates a front orthogonal view of the solar powered wheel apparatus mounted on a wheel of a bicycle.

FIG. 37 exemplarily illustrates a front orthogonal view of the solar powered wheel apparatus 100 mounted on a wheel 105 of the bicycle 3500. A rotatable element 101 housing one or more photovoltaic cells 102 is disposed on the wheel 105 of the bicycle 3500. The rotatable element 101 is rigidly or hingedly connected within the rim 105c of the wheel 105 of the bicycle 3500. The photovoltaic cells 102 capture solar energy and convert the solar energy into electrical energy that powers the electric motor 103. The electric motor 103 rotates about the axial shaft 104, thereby rotating the wheel 105 of the bicycle 3500.

Figure 38:
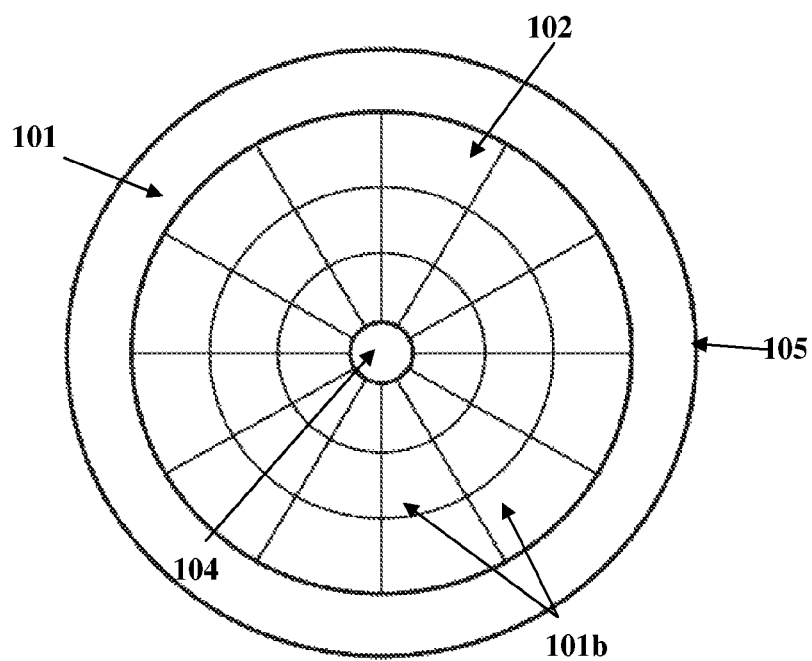
FIG. 38 exemplarily illustrates a sectional view of the solar powered wheel apparatus mounted on a wheel of a bicycle, where the rotatable element is disposed on opposing sides of the wheel.

FIG. 38 exemplarily illustrates a sectional view of the solar powered wheel apparatus 100 mounted on a wheel 105 of the bicycle 3500, where the rotatable element 101 is disposed on opposing sides 105a and 105b of the wheel 105. The photovoltaic cells 102 are accommodated in different sectors 101b defined on the rotatable element 101.

Figure 39:
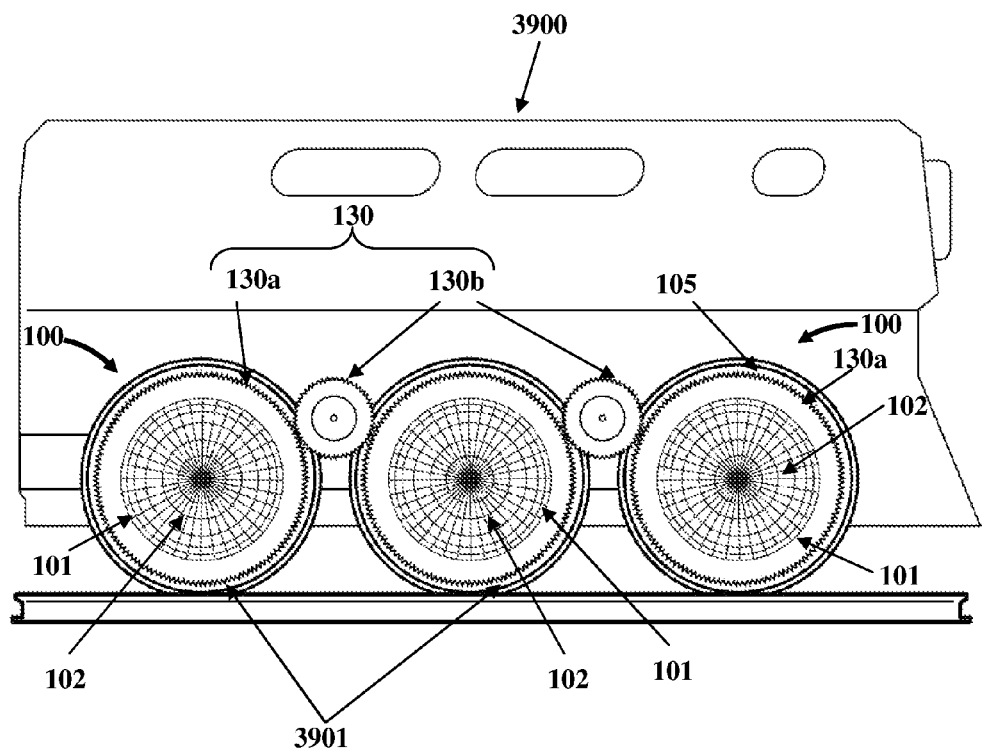
FIG. 39 exemplarily illustrates an orthogonal view of a train locomotive, showing solar powered wheel apparatuses mounted on multiple wheels of the train locomotive interconnected via drive mechanisms.

FIG. 39 exemplarily illustrates an orthogonal view of a train locomotive 3900, showing solar powered wheel apparatuses 100 mounted on multiple wheels 105 of the train locomotive 3900 interconnected via drive mechanisms 130. The drive mechanisms 130 comprise, for example, a ring gear 130a and intermediary gears 130b. The ring gear 130a is rigidly connected around the rotatable element 101 connected to the wheel 105 and on each of the second wheels 3901. The wheel 105 and the second wheels 3901 are interconnected by the engageable communication of each ring gear 130a with intermediary gears 130b. The ring gear 130a of the wheel 105 engageably communicates with the ring gear 130a of the second wheels 3901 for transferring the mechanical energy produced by an in-wheel electric motor 103 of the wheel 105 to the second wheels 3901 via the intermediary gears 130b. The in-wheel electric motor 103 of each of the wheels 105 and 3901 is powered by the photovoltaic cells 102 housed on the rotatable element 101. The axial shaft 104 of the electric motor 103 in each of the wheels 105 and 3901 is rigidly connected to the support structure (not shown) of the train locomotive 3900. The photovoltaic cells 102 on the first wheel 105 capture solar energy and convert the solar energy into electrical energy. The electric motor 103 connected to the photovoltaic cells 102 converts the electrical energy into mechanical energy and rotates the first wheel 105 at high revolutions per minute (rpm). The rotation of the first wheel 105 causes rotation of the second wheels 3901 via the ring gear 130a and the intermediary gears 130b. The ring gear 130a of the first wheel 105 engageably communicates with the ring gear 130a of the second wheel 3901 via the intermediary gears 130b, thereby resulting in motion of the train locomotive 3900.

In an embodiment, a second set of wheels (not shown), each having photovoltaic cells 102 and the electric motor 103 is provided. The second set of wheels is positioned above the first set of wheels 105 and is connected to the first set of wheels 105 via the drive mechanisms 130. The photovoltaic cells 102 on the second set of wheels capture solar energy and convert the solar energy into electrical energy. The electric motor 103 connected to the photovoltaic cells 102 converts the electrical energy into mechanical energy and rotates the second set of wheels at high rpm. The interconnection of the wheels 105 using the drive mechanisms 130 enables effective energy transfer between the interconnected first set of wheels 105 and the second set of wheels. The interconnection of the wheels 105 using the drive mechanisms 130 enables the first set of wheels 105 to rotate in one direction, for example, a counterclockwise direction and the second set of wheels in an opposite direction, for example, a clockwise direction.

The photovoltaic cells 102 may be provided on one or more of the second wheels 3901. The rotation of a first wheel 105 is transmitted to a second wheel 3901 and the rotation of the second wheel 3901 is transmitted to the third wheel and so on. The solar powered wheel apparatus 100 in this embodiment may be used, for example, in locomotives such as trains 3900, trams, carriages, etc., where the solar powered wheel apparatus 100 may be provided on one wheel 105 which in turn propels the vehicle, that is, the train 3900, a tram, a carriage, etc., by transferring energy through the interconnected set of wheels 105 and 3901.

Figure 40:
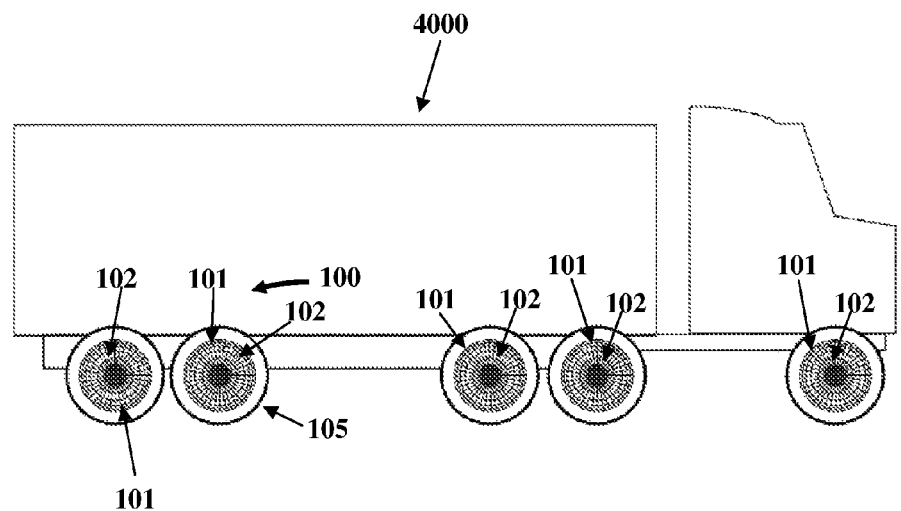
FIG. 40 exemplarily illustrates an orthogonal view of a truck, showing solar powered wheel apparatuses mounted on the wheels of the truck.

FIG. 40 exemplarily illustrates an orthogonal view of a truck 4000, showing solar powered wheel apparatuses 100 mounted on the wheels 105 of the truck 4000. In this embodiment, the rotatable element 101 is mounted on each of the wheels 105 of the truck 4000. The truck 4000 is, for example, a carriage vehicle or any other goods carrier. The rotatable element 101 is electrically connected to the in-wheel electric motor 103, which rotates about the axial shaft 104 on transfer of the electrical energy from the photovoltaic cells 102. The photovoltaic cells 102 housed on the rotatable element 101 mounted on each of the wheels 105 capture solar energy and convert the solar energy into electrical energy for rotating the electric motor 103. The electrical energy is then converted to mechanical energy of the wheels 105, which rotate causing the truck 4000 to move forward.

Figure 41A:
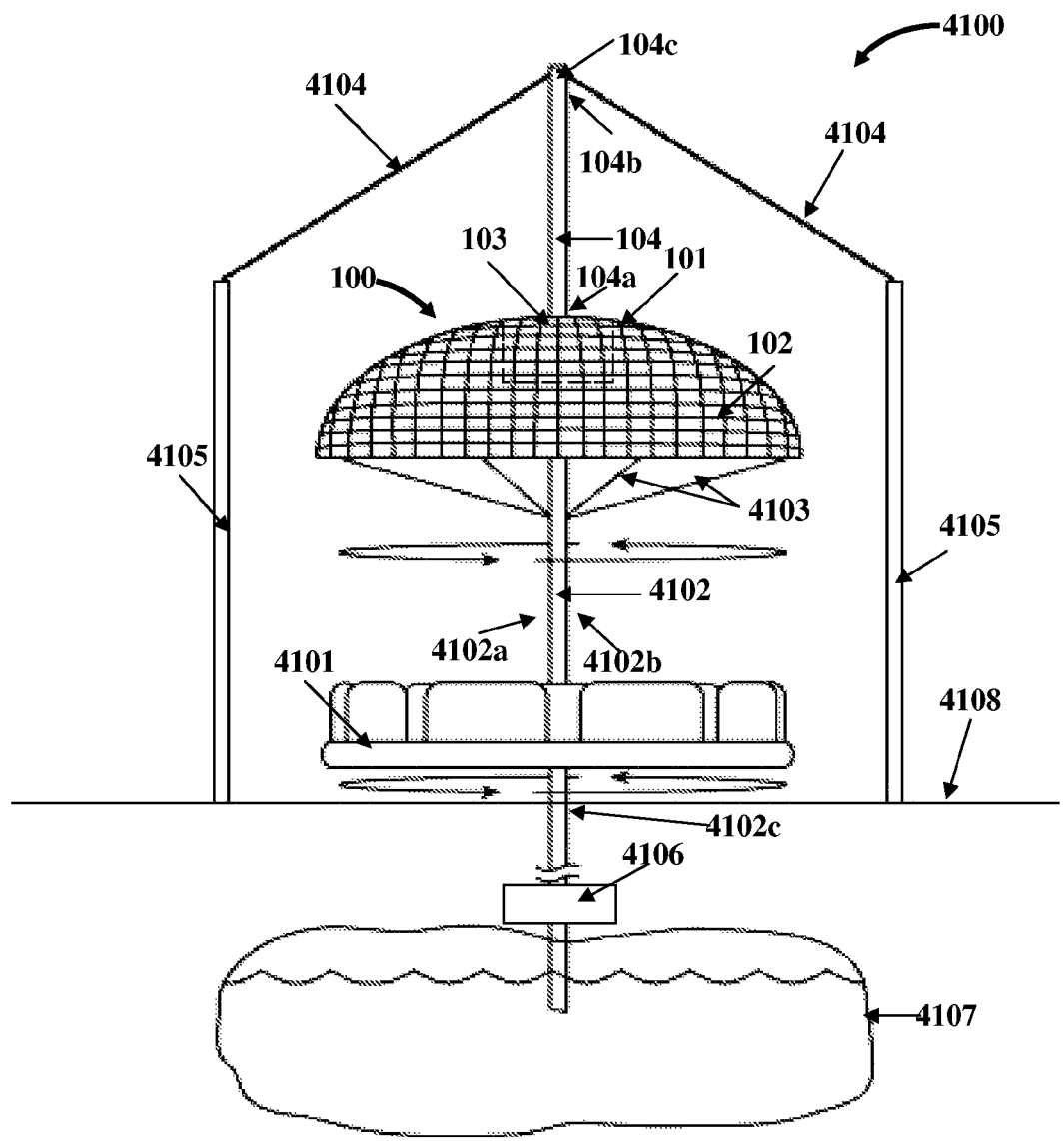
FIGS. 41A-41C exemplarily illustrate an embodiment of the solar powered wheel apparatus incorporated in an amusement riding apparatus.
Figure 41B:
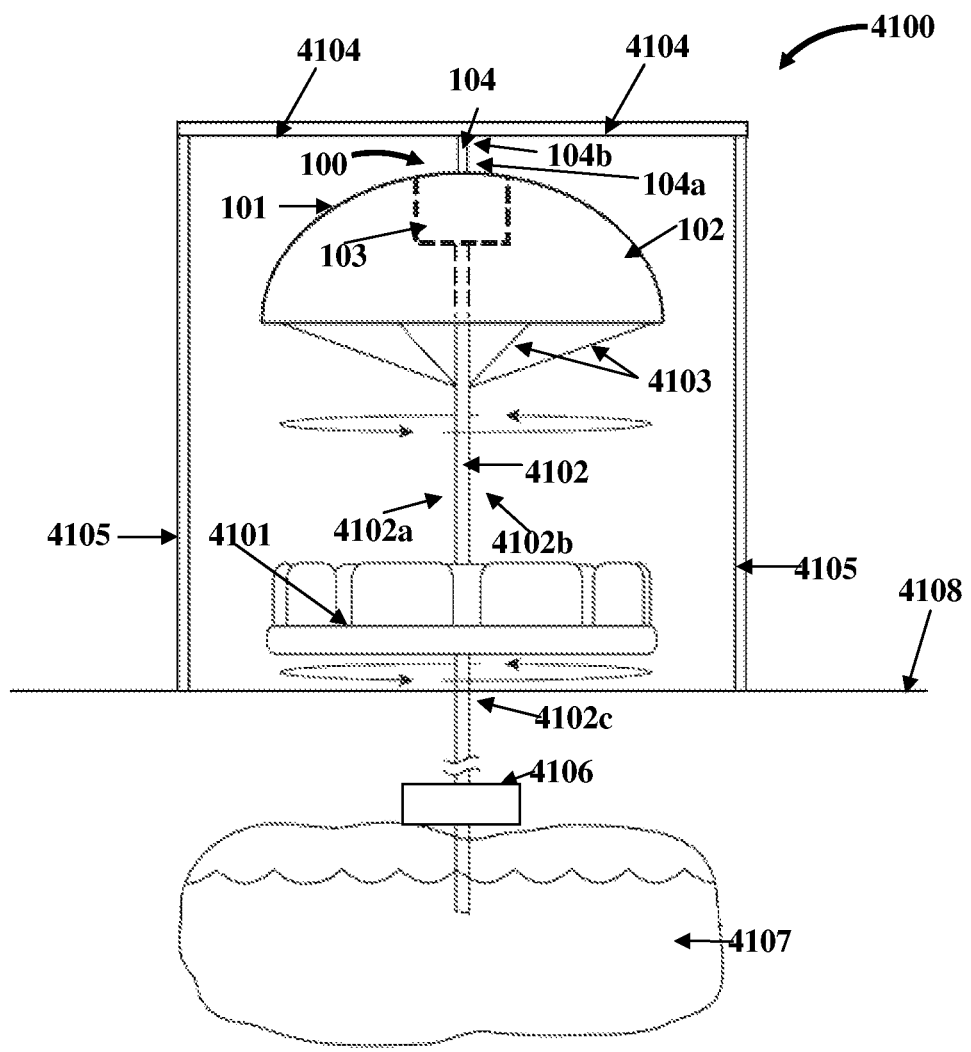
Figure 41C:
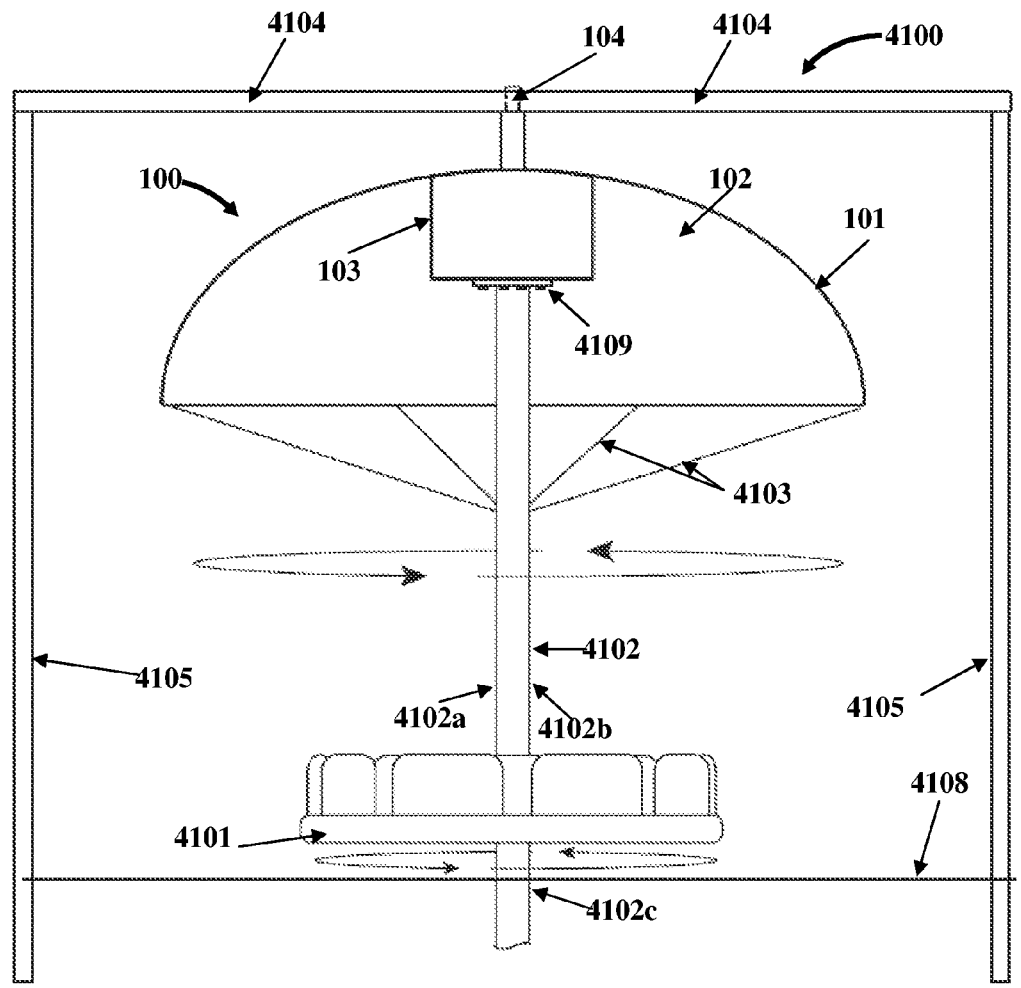

FIGS. 41A-41C exemplarily illustrate an embodiment of the solar powered wheel apparatus 100 incorporated in an amusement riding apparatus 4100. A spinning wheel 4101 of the amusement riding apparatus 4100, for example, a carousel, is rigidly connected to a central support structure 4102. In this embodiment, the rotatable element 101 of the solar powered wheel apparatus 100 having, for example, a dome profile is disposed on and connected to the central support structure 4102, for example, using tensioned cables 4103 as exemplarily illustrated in FIGS. 41A-41C. The electric motor 103 is rigidly connected within the rotatable element 101 to the central support structure 4102 and rotatably connected to the axial shaft 104. The axial shaft 104 extends upwardly from the rotatable element 101. The axial shaft 104 is also rigidly connected within the central support structure 4102, for example, by a cotter pin 4109 as exemplarily illustrated in FIG. 41C. The first end 104a of the axial shaft 104 is connected to the electric motor 103. The second end 104b of the axial shaft 104 defines a pivot 104c that rigidly connects to lateral support structures 4105 via rigid connecting rods 4104, for example, made of steel, on both sides 4102a and 4102b of the central support structure 4102. The rigid connecting rods 4104 and the lateral support structures 4105 define a rigid framework for supporting and stabilizing the amusement riding apparatus 4100 on a ground surface 4108. The rigid connecting rods 4104 and the lateral support structures 4105 also provide a rigid connection for the axial shaft 104.

The bottom end 4102c of the central support structure 4102 is connected to a water pump 4106 below the ground surface 4108 as exemplarily illustrated in FIGS. 41A-41C. The water pump 4106 is in fluid communication with a water bed 4107 below the ground surface 4108. The underground water bed 4107 is, for example, an aquifer, a well, a water sump or any other body natural or man-made that stores water underground. On receiving solar energy from sunlight, the photovoltaic cells 102 housed on the rotatable element 101 of the solar powered wheel apparatus 100 convert the solar energy to electrical energy. The electrical energy is transferred to the electric motor 103 causing the electric motor 103 to rotate about the rigidly connected axial shaft 104. The rotation of the electric motor 103 causes rotation of the central support structure 4102, thereby aiding rotation of the spinning wheel 4101 of the amusement riding apparatus 4100. The rotation of the central support structure 4102 connected to the water pump 4106 causes the water pump 4106 to rotate. The vacuum created by rotation of the water pump 4106 draws water from the water bed 4107 to an external source (not shown). The external source is, for example, an overhead water tank or any other storage body.

Figure 42:
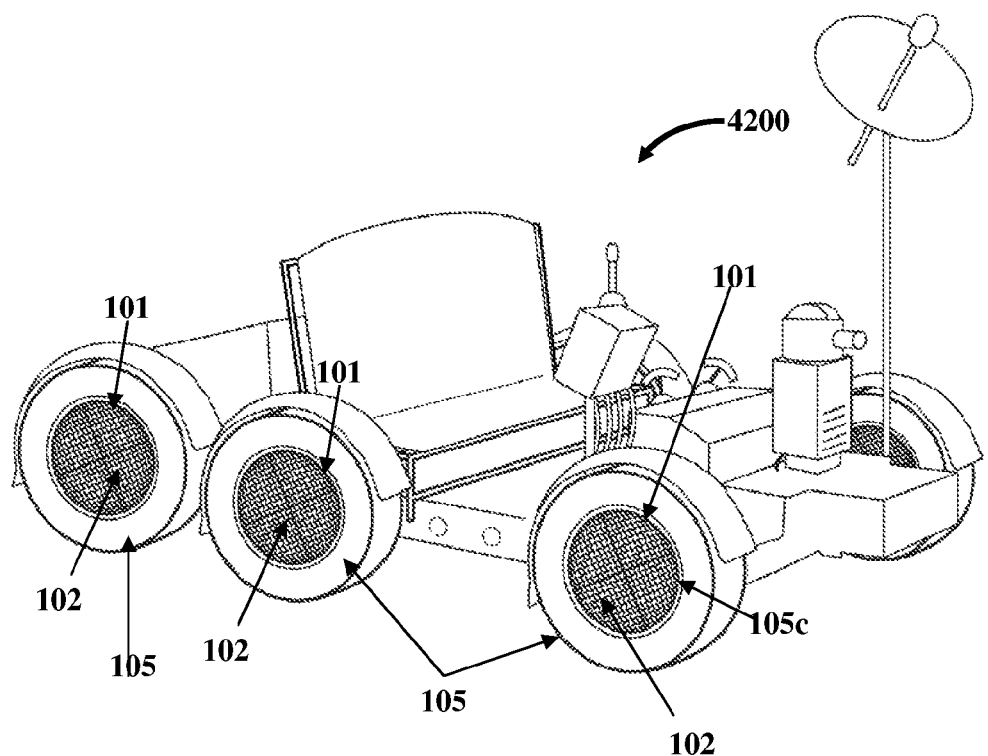
FIG. 42 exemplarily illustrates a perspective view of a space vehicle, showing the solar powered wheel apparatus mounted on each of the wheels of the space vehicle.

FIG. 42 exemplarily illustrates a perspective view of a space vehicle 4200, showing the solar powered wheel apparatus 100 mounted on each of the wheels 105 of the space vehicle 4200. The solar powered wheel apparatus 100 is disposed in each of the wheels 105 of the space vehicle 4200. The rotatable element 101 that houses the photovoltaic cells 102 is rigidly connected to the rim 105c of each of the wheels 105 of the space vehicle 4200. The space vehicle 4200 can be used for travel on the surface of planets and satellites, and transports astronauts from one location to another. During operation, the photovoltaic cells 102 on the wheels 105 capture solar energy and convert the solar energy into electrical energy, which drives the electric motor 103. The electric motor 103 rotates about the axial shaft 104 and causes rotation of each of the wheels 105 of the space vehicle 4200. The space vehicle 4200 moves ahead through rotary energy that is made available at the wheels 105 of the space vehicle 4200.

Figure 43:
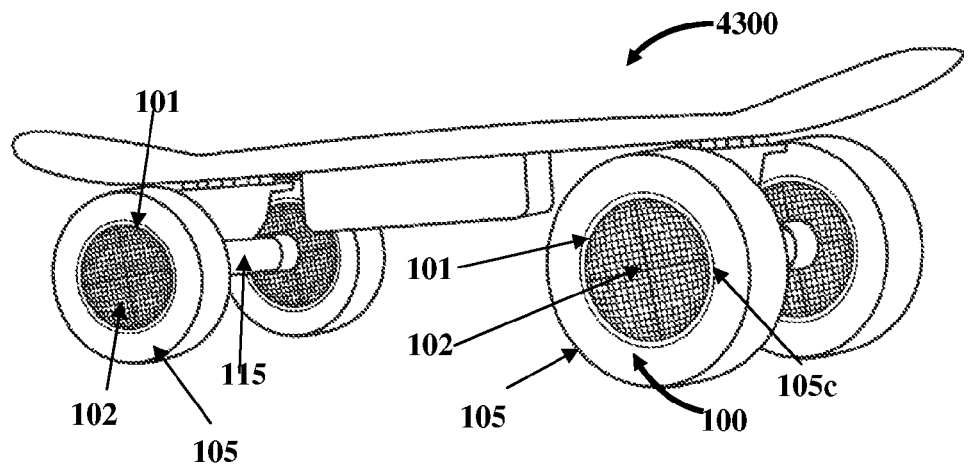
FIG. 43 exemplarily illustrates a perspective view of a skateboard, showing the solar powered wheel apparatus mounted on each of the wheels of the skateboard.

FIG. 43 exemplarily illustrates a perspective view of a skateboard 4300, showing the solar powered wheel apparatus 100 mounted on each of the wheels 105 of the skateboard 4300. The solar powered wheel apparatus 100 is disposed on each of the wheels 105 of the skateboard 4300. The rotatable element 101 that houses the photovoltaic cells 102 is rigidly connected to the rim 105c of each of the wheels 105 of the skateboard 4300. During operation, a user stands on the skateboard 4300 and the skateboard 4300 moves forward through combined effort of the user and mechanical energy that is generated at the wheels 105 by the transfer of electrical energy of the photovoltaic cells 102 to the electric motor 103.

Figure 44:
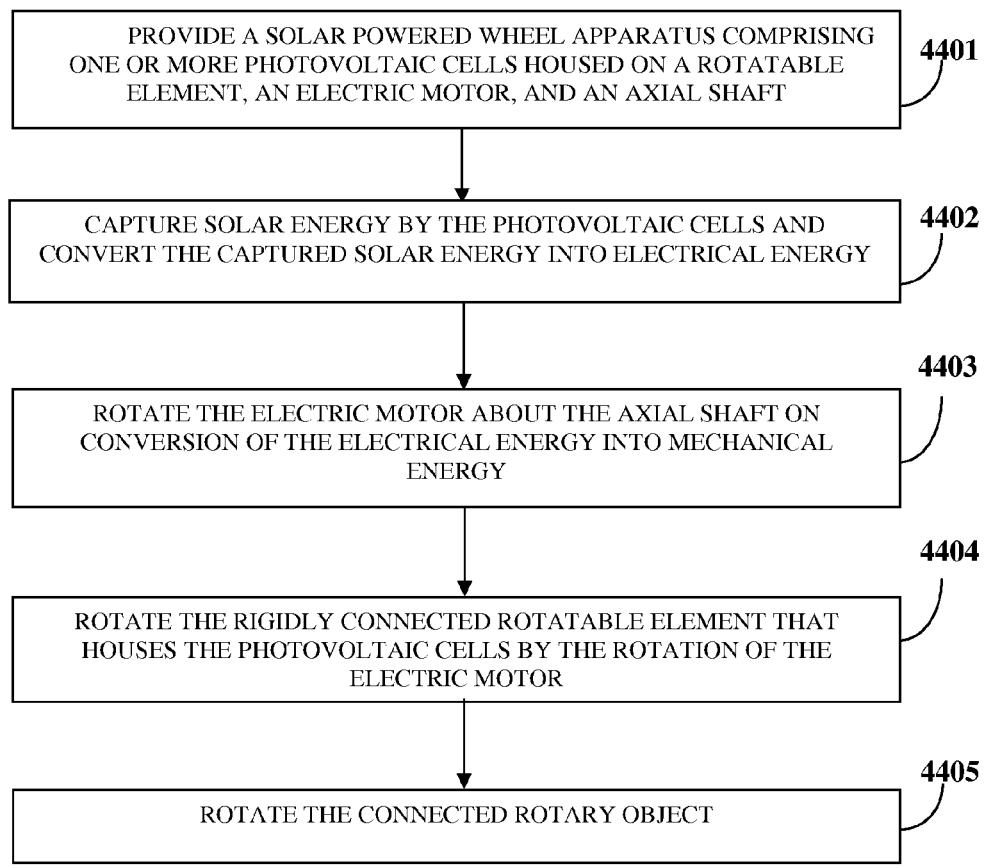
FIG. 44 illustrates a method for causing rotation of a rotary object using the solar powered wheel apparatus.

FIG. 44 illustrates a method for causing rotation of a rotary object 105 using the solar powered wheel apparatus 100. The solar powered wheel apparatus 100 comprising one or more photovoltaic cells 102 housed on the rotatable element 101, an electric motor 103, and an axial shaft 104 as exemplarily illustrated and disclosed in the detailed description of FIGS. 1-43 is provided 4401. The photovoltaic cells 102 capture 4402 solar energy and convert the captured solar energy to electrical energy. The electrical energy powers the electric motor 103. The electric motor 103 rotates 4403 about the axial shaft 104 on conversion of the electrical energy produced by the photovoltaic cells 102 into mechanical energy. The rigidly connected rotatable element 101 that houses the photovoltaic cells 102 is rotated 4404 by the rotation of the electric motor 103. The rotation of the rotatable element 101 housing the photovoltaic cells 102 by the electric motor 103 removes heat from the photovoltaic cells 102 and causes rotation 4405 of the connected rotary object 105. For example, the rotation of the rotatable element 101 connected to each of the wheels 105 of a vehicle, for example, a car 900, a bicycle 3500, etc., propels the vehicle 900, 3500, etc.

Consider an example, where the solar powered wheel apparatus 100 is utilized in a wheel 105 of a vehicle, for example, a car 900. On exposure to sunlight, the photovoltaic cells 102 of the solar powered wheel apparatus 100 capture the incident solar energy and convert the captured solar energy into electrical energy, for example, direct current. This electrical energy, that is, direct current (DC) is fed to the electrically and rigidly connected electric motor 103, for example, a DC motor. The electric motor 103 starts to convert the electrical energy and rotates itself about the axial shaft 104. The rotation of the electric motor 103 causes rotation of the rotatable element 101 that houses the photovoltaic cells 102, which rotates the wheel 105 of the car 900. During the rotation of the rotatable element 101 with the wheel 105 and the electric motor 103, the photovoltaic cells 102, which are constantly exposed to sunlight, begin to lose heat. This removal of heat from the photovoltaic cells 102 enables the photovoltaic cells 102 to operate at a much lower temperature. Thus, the efficiency of the photovoltaic cells 102 in producing electrical energy as required by the electric motor 103 to propel the car 900 is increased.

While the photovoltaic cells 102 lose heat and continue to produce electrical energy, the additional attachments, if any, such as reflectors 116 or lenses 119 cause the photovoltaic cells 102 to be exposed to a greater amount of solar energy. This increase in exposure to sunlight and the operation of the photovoltaic cells 102 at lower temperatures increases the overall efficiency of the solar powered wheel apparatus 100.

The foregoing examples have been provided merely for the purpose of explanation and are in no way to be construed as limiting of the present invention disclosed herein. While the invention has been described with reference to various embodiments, it is understood that the words, which have been used herein, are words of description and illustration, rather than words of limitation. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

We claim:

1. A solar powered wheel apparatus comprising:
   one or more photovoltaic cells housed on a rotatable element, wherein said one or more photovoltaic cells capture solar energy and convert said solar energy into electrical energy, and wherein said rotatable element is hingedly connected to a rotary object for angularly displacing said rotatable element from said rotary object to increase exposure of said one or more photovoltaic cells to sunlight, wherein said exposed one or more photovoltaic cells capture additional solar energy and convert said captured solar energy into said electrical energy, when said rotary object is stationary;
   an electric motor in electric communication with said one or more photovoltaic cells that power said electric motor, wherein said electric motor is rigidly connected to said rotatable element that houses said one or more photovoltaic cells; and
   an axial shaft rotatably connected to said electric motor and rigidly connected to a support structure of said rotary object, wherein said electric motor converts said electrical energy produced by said one or more photovoltaic cells into mechanical energy and rotates about said axial shaft, wherein said rotation of said electric motor rotates said rigidly connected rotatable element that houses said one or more photovoltaic cells;
   whereby said rotation of said rotatable element housing said one or more photovoltaic cells by said electric motor removes heat from said one or more photovoltaic cells and causes rotation of said connected rotary object.

2. The solar powered wheel apparatus of claim 1, wherein said rotatable element comprises a ring shaped panel and a plurality of rectangular panels rigidly connected to said rotary object for housing said one or more photovoltaic cells, wherein each of said rectangular panels radially extends from an upper surface of said electric motor to said ring shaped panel, wherein a first end of each of said rectangular panels is electrically connected to said upper surface of said electric motor, and wherein a second end of each of said rectangular panels is connected to said ring shaped panel.

3. The solar powered wheel apparatus of claim 1, further comprising one or more reflectors disposed in a plurality of positions on a body frame mounted on said rotary object, wherein said one or more reflectors are disposed proximal to said one or more photovoltaic cells housed on said rotatable element and positioned to concentrate said solar energy on said one or more photovoltaic cells.

4. The solar powered wheel apparatus of claim 1, further comprising one or more concentrator lenses disposed on said rotatable element to concentrate said solar energy on said one or more photovoltaic cells housed on said rotatable element.

5. The solar powered wheel apparatus of claim 1, further comprising a drive mechanism rigidly connected around said rotatable element connected to said rotary object and a plurality of second rotary objects to interconnect said rotary object and said second rotary objects, wherein said drive mechanism on said rotary object engageably communicates with said drive mechanism on said second rotary objects for transferring said mechanical energy produced by said electric motor of said rotary object to said second rotary objects.

6. The solar powered wheel apparatus of claim 1, further comprising an extendable hydraulic arm connected to said support structure of said rotary object, wherein a first end of said extendable hydraulic arm defines a hinge joint for pivotally connecting said rotatable element that houses said one or more photovoltaic cells via said axial shaft, and wherein a second end of said extendable hydraulic arm rigidly connects to said support structure of said rotary object, wherein said extendable hydraulic arm is extended from said support structure of said rotary object, and said pivotally connected rotatable element is angularly displaced via said hinge joint for increasing exposure of said one or more photovoltaic cells to sunlight, wherein said exposed one or more photovoltaic cells capture additional solar energy and convert said captured solar energy into said electrical energy, when said rotary object is stationary.

7. The solar powered wheel apparatus of claim 1, wherein said rotatable element that houses said one or more photovoltaic cells is disposed on opposing sides of said rotary object.

8. The solar powered wheel apparatus of claim 7, further comprising slip rings connected to each said rotatable element for transferring electrical energy from one said rotatable element housing said one or more photovoltaic cells on one of said opposing sides of said rotary object to said electric motor in electric communication with said one or more photovoltaic cells of another said rotatable element on another one of said opposing sides of said rotary object.

9. A method for causing rotation of a rotary object, comprising:
providing a solar powered wheel apparatus comprising:
one or more photovoltaic cells housed on a rotatable element, wherein said rotatable element is hingedly connected to said rotary object for angularly displacing said rotatable element from said rotary object to increase exposure of said one or more photovoltaic cells to sunlight, wherein said exposed one or more photovoltaic cells capture additional solar energy and convert said captured solar energy into said electrical energy, when said rotary object is stationary;

an electric motor in electric communication with said one or more photovoltaic cells, wherein said electric motor is rigidly connected to said rotatable element that houses said one or more photovoltaic cells; and
an axial shaft rotatably connected to said electric motor and rigidly connected to a support structure of said rotary object;
capturing solar energy by said one or more photovoltaic cells and converting said captured solar energy into electrical energy, wherein said electrical energy powers said electric motor;
rotating said electric motor about said axial shaft on conversion of said electrical energy produced by said one or more photovoltaic cells into mechanical energy by said electric motor; and
rotating said rigidly connected rotatable element that houses said one or more photovoltaic cells by said rotation of said electric motor, wherein said rotation of said rotatable element housing said one or more photovoltaic cells by said electric motor removes heat from said one or more photovoltaic cells and causes rotation of said connected rotary object.

10. The method of claim 9, further comprising concentrating said solar energy on said one or more photovoltaic cells housed on said rotatable element by one or more reflectors disposed in a plurality of positions on a body frame mounted on said rotary object.

11. The method of claim 9, further comprising concentrating said solar energy on said one or more photovoltaic cells housed on said rotatable element by one or more concentrator lenses disposed on said rotatable element.

12. The method of claim 9, further comprising interconnecting a plurality of second rotary objects to said rotary object via a drive mechanism rigidly connected around said rotatable element connected to said rotary object and each of said second rotary objects, wherein said drive mechanism on said rotary object engageably communicates with said drive mechanism of said second rotary objects for transferring said mechanical energy produced by said electric motor of said rotary object to said second rotary objects.

13. The method of claim 9, further comprising transferring said electrical energy produced by said one or more photovoltaic cells to an energy storage device disposed within said support structure connected to said rotary object via slip rings in electric communication with said one or more photovoltaic cells, said energy storage device, and said electric motor, for storing said electrical energy, wherein said stored electrical energy is transferred from said energy storage device to said electric motor via said slip rings.

14. The method of claim 9, further comprising electronically controlling said transfer of said electrical energy from said one or more photovoltaic cells to said electric motor through slip rings to transfer power equally between each said rotary object of a plurality of interconnected rotary objects.

15. The method of claim 9, further comprising angularly displacing said rotatable element that houses said one or more photovoltaic cells from said rotary object for increasing exposure of said one or more photovoltaic cells to sunlight, wherein said exposed one or more photovoltaic cells capture additional solar energy and convert said captured solar energy into said electrical energy, when said rotary object is stationary.

* * * * *